(12) United States Patent
Lee et al.

(10) Patent No.: US 11,209,641 B2
(45) Date of Patent: Dec. 28, 2021

(54) MICROMACHINED MIRROR ASSEMBLY HAVING REFLECTIVE LAYERS ON BOTH SIDES

(71) Applicant: BEIJING VOYAGER TECHNOLOGY CO., LTD., Beijing (CN)

(72) Inventors: Sae Won Lee, Mountain View, CA (US); Youmin Wang, Berkeley, CA (US); Qin Zhou, Mountain View, CA (US)

(73) Assignee: BEIJING VOYAGER TECHNOLOGY CO., LTD., Beijing (CN)

( * ) Notice: Subject to any disclaimer, the term of this patent is extended or adjusted under 35 U.S.C. 154(b) by 235 days.

(21) Appl. No.: 16/237,204

(22) Filed: Dec. 31, 2018

(65) Prior Publication Data
US 2020/0209615 A1     Jul. 2, 2020

(51) Int. Cl.
| | | |
|---|---|---|
| *G02B 26/08* | (2006.01) | |
| *B81C 1/00* | (2006.01) | |
| *G01S 7/481* | (2006.01) | |
| *G01S 17/931* | (2020.01) | |
| *G01S 7/484* | (2006.01) | |

(52) U.S. Cl.
CPC ...... *G02B 26/0841* (2013.01); *B81C 1/00047* (2013.01); *B81C 1/00198* (2013.01); *B81C 1/00349* (2013.01); *B81C 1/00404* (2013.01); *G01S 7/484* (2013.01); *G01S 7/4817* (2013.01); *G01S 17/931* (2020.01); *B81B 2201/042* (2013.01)

(58) Field of Classification Search
CPC ............... G02B 26/0841; G02B 26/10; B81C 1/00198; B81C 1/00047; B81C 1/00349; B81C 1/00404; G01S 7/484; G01S 17/931; G01S 7/4817; G01S 7/4863; B81B 2201/042
USPC ...................................................... 359/201.2
See application file for complete search history.

(56) References Cited

U.S. PATENT DOCUMENTS

| | | | | |
|---|---|---|---|---|
| 7,952,781 | B2 * | 5/2011 | Weiss ................... | G02B 26/105 |
| | | | | 359/201.1 |
| 9,435,638 | B2 * | 9/2016 | Chayat ................ | G02B 26/085 |
| | | (Continued) | | |

FOREIGN PATENT DOCUMENTS

| | | |
|---|---|---|
| CN | 105353506 A | 2/2016 |
| KR | 20030030239 A | 4/2003 |

OTHER PUBLICATIONS

International Search Report issued in corresponding International Application No. PCT/US2018/068222, dated Apr. 26, 2019, 4 pages.

(Continued)

*Primary Examiner* — Euncha P Cherry
(74) *Attorney, Agent, or Firm* — Bayes PLLC

(57) ABSTRACT

Embodiments of the disclosure provide a micromachined mirror assembly having a mirror-base layer, a first reflective layer on a top surface of the mirror-base layer, and a second reflective layer on a bottom surface of the mirror-base layer. In an example, the first reflective layer is reflective to incident light of the micromachined mirror assembly, and the first reflective layer and the second reflective layer are made of a same material and have same dimensions.

20 Claims, 18 Drawing Sheets

(56) References Cited

U.S. PATENT DOCUMENTS

| | | | |
|---|---|---|---|
| 2003/0024989 A1* | 2/2003 | Aizawa | G06K 7/10653 235/462.36 |
| 2008/0049292 A1 | 2/2008 | Matsuo et al. | |
| 2008/0130081 A1 | 6/2008 | Tsai et al. | |
| 2009/0109512 A1 | 4/2009 | Park | |
| 2017/0297898 A1 | 10/2017 | Torkkeli et al. | |

OTHER PUBLICATIONS

Written Opinion of the International Searching Authority issued in corresponding International Application No. PCT/US2018/068222, dated Apr. 26, 2019, 6 pages.

* cited by examiner

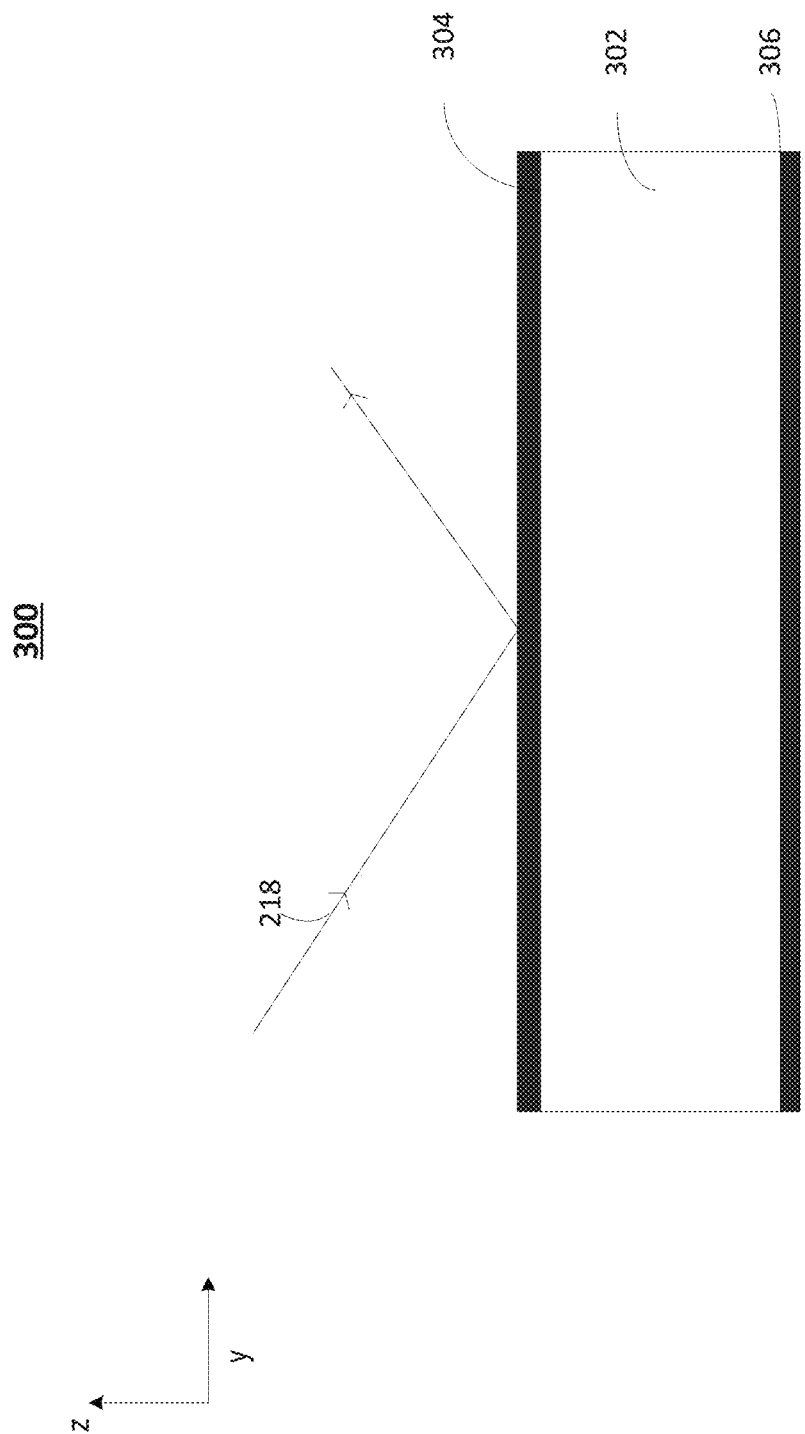

MICROMACHINED MIRROR ASSEMBLY HAVING REFLECTIVE LAYERS ON BOTH SIDES

TECHNICAL FIELD

The present disclosure relates to a micromachined mirror assembly, and more particularly to, a micromachined mirror assembly used in a scanner for light detection and ranging (LiDAR).

BACKGROUND

LiDAR systems have been widely used in autonomous driving and producing high-definition maps. For example, LiDAR systems measure distance to a target by illuminating the target with pulsed laser light and measuring the reflected pulses with a sensor. Differences in laser return times and wavelengths can then be used to make digital three-dimensional (3-D) representations of the target. The laser light used for LiDAR scan may be ultraviolet, visible, or near infrared. Because using a narrow laser beam as the incident light from the scanner can map physical features with very high resolution, a LiDAR system is particularly suitable for applications such as high-definition map surveys.

The scanner of a LiDAR system includes a mirror that can be moved (e.g., rotated) by an actuator to reflect (and steer) incident laser beams from a laser source towards a predetermined angle. The mirror can be a single, or an array of micromachined mirror assembly(s) made by semiconductor materials using microelectromechanical system (MEMS) technologies. However, since LiDAR systems (including the micromachined mirror assembly) are typically used in an environment in which the temperature variation is significant, the thermal expansion and contraction of the materials forming the micromachined mirror assembly due to the temperature variation can cause the change of curvature of the micromachined mirror assembly, which in turn affects the performance of the LiDAR scanner, e.g., by causing beam divergence.

Embodiments of the disclosure address the above problems by an improved micromachined mirror assembly in a scanner for LiDAR.

SUMMARY

Embodiments of the disclosure provide a micromachined mirror assembly. The micromachined mirror assembly includes. a mirror-base layer, a first reflective layer on a top surface of the mirror-base layer, and a second reflective layer on a bottom surface of the mirror-base layer. The first reflective layer is reflective to incident light of the micromachined mirror assembly, and the first reflective layer and the second reflective layer are made of a same material and have same dimensions.

Embodiments of the disclosure also provide a method for forming a micromachined mirror assembly. The method includes the following operations. First, an initial mirror-base layer is formed on a top surface of a material substrate, the initial mirror-base layer exposing a first surface. A portion of the material substrate is removed to expose a second surface of the initial mirror-base layer and form a mirror-base layer that exposes a top surface and a bottom surface of the mirror-base layer. A first reflective layer is formed on the top surface of the material substrate and a second reflective layer on the bottom surface of the material substrate. The first reflective layer and the second reflective layer are made of a same material and have same dimensions.

Embodiments of the disclosure also provides a method for forming a micromachined mirror assembly. The method includes the following operations. First, an initial mirror-base layer is formed on a top surface of a material substrate, the initial mirror-base layer exposing a first surface. The material substrate is bonded with another material substrate. The other material substrate has a cavity that exposes the first surface of the initial mirror-base layer. A top portion of the material substrate is removed to expose a second surface of the initial mirror-base layer and form a mirror-base layer that exposes a top surface and a bottom surface of the mirror-base layer. A first reflective layer is then formed on the top surface of the mirror-base layer and a second reflective layer is formed on the bottom surface of the mirror-base layer. The first reflective layer and the second reflective layer are made of a same material and have same dimensions.

It is to be understood that both the foregoing general description and the following detailed description are exemplary and explanatory only and are not restrictive of the invention, as claimed.

BRIEF DESCRIPTION OF THE DRAWINGS

FIG. 3 illustrates a cross-sectional view of a micromachined mirror assembly, according to embodiments of the disclosure.

DETAILED DESCRIPTION

Reference will now be made in detail to the exemplary embodiments, examples of which are illustrated in the accompanying drawings. Wherever possible, the same reference numbers will be used throughout the drawings to refer to the same or like parts.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

MEMS micro-mirrors are considered as a good alternative to reduce the cost of LiDAR systems. In order to have sufficient resolution for long range detection for LiDAR applications, it is imperative that the light-reflecting surface of a micro-mirror stays even to achieve desirably small divergence under various operating conditions. If micro-mirror is used in a LiDAR system and its optical evenness and thus its divergence is sensitive to temperature variations, long range and even mid-range scanning ability would be completely lost outside a very narrow temperature range. When creating reflective micro-mirror using standard MEMS fabrication processes, properties of the resulting structure to be considered are, e.g., reflectivity, residual film stress, and modulus of elasticity, to name a few. To achieve desired values for these parameters, it may require that multiple layers with different material properties to be used together. However, fabricating a large and even micro-mirror for high optical gain is extremely challenging even without considering the effect of temperature variation on these suspended and extremely thin structures. Semiconductor materials typically used in MEMS and metals typically used to make MEMS structures often have different coefficients of thermal expansion, resulting in bi-morph stresses and bow on the light-reflect surface even with slight temperature variation.

Figure 1:
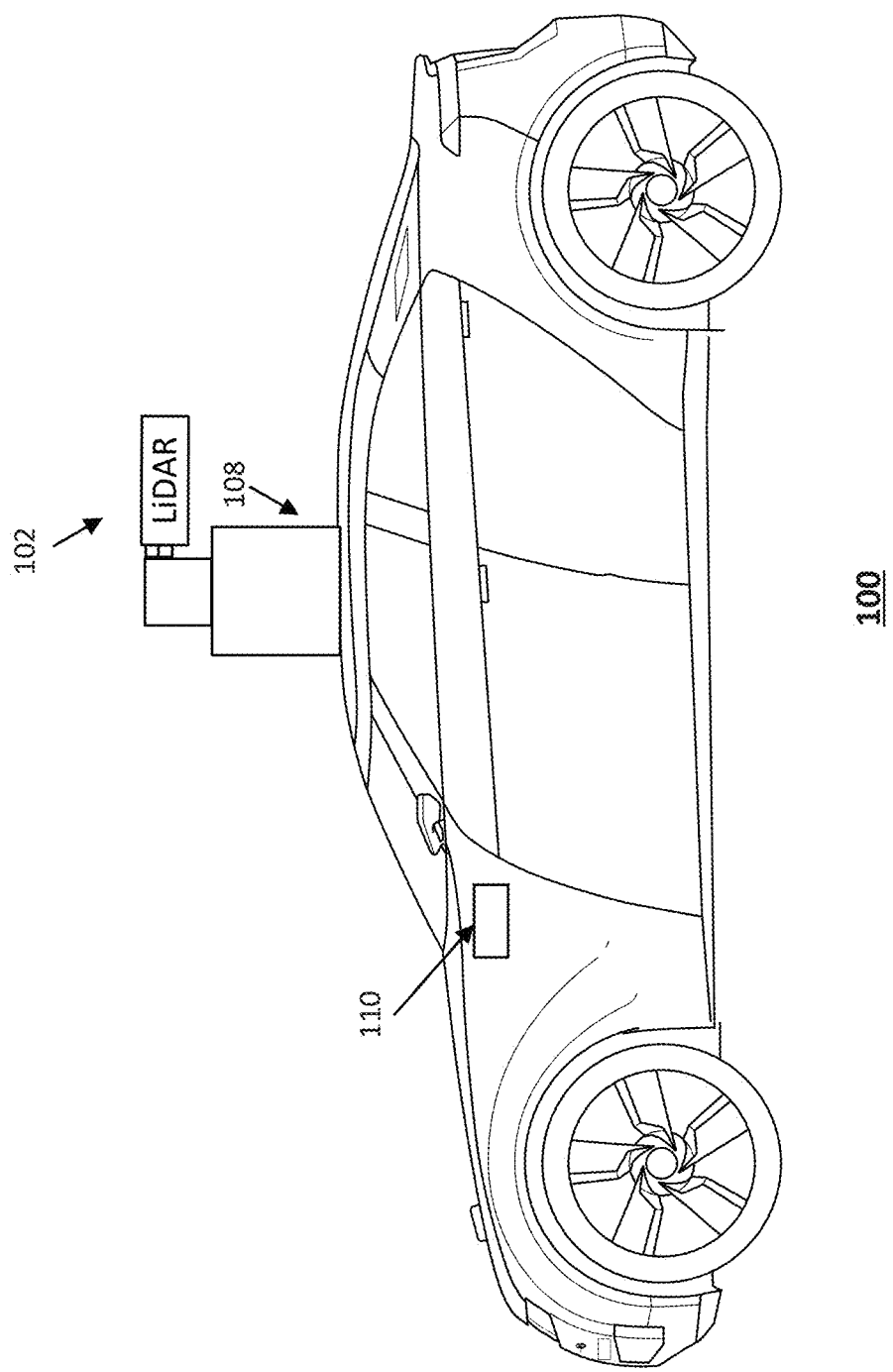
FIG. 1 illustrates a schematic diagram of an exemplary vehicle equipped with a LiDAR system, according to embodiments of the disclosure.

FIG. 1 illustrates a schematic diagram of an exemplary vehicle 100 equipped with a LiDAR system 102, according to embodiments of the disclosure. Consistent with some embodiments, vehicle 100 may be a survey vehicle configured for acquiring data for constructing a high-definition map or 3-D buildings and city modeling.

As illustrated in FIG. 1, vehicle 100 may be equipped with LiDAR system 102 mounted to body 104 via a mounting structure 108. Mounting structure 108 may be an electro-mechanical device installed or otherwise attached to body 104 of vehicle 100. In some embodiments of the present disclosure, mounting structure 108 may use screws, adhesives, or another mounting mechanism. Vehicle 100 may be additionally equipped with a sensor 110 inside or outside body 104 using any suitable mounting mechanisms. Sensor 110 may include sensors used in a navigation unit, such as a Global Positioning System (GPS) receiver and one or more Inertial Measurement Unit (IMU) sensors. It is contemplated that the manners in which LiDAR system 102 or sensor 110 can be equipped on vehicle 100 are not limited by the example shown in FIG. 1 and may be modified depending on the types of LiDAR system 102 and sensor 110 and/or vehicle 100 to achieve desirable 3-D sensing performance.

Consistent with some embodiments, LiDAR system 102 and sensor 110 may be configured to capture data as vehicle 100 moves along a trajectory. For example, a transmitter of LiDAR system 102 is configured to scan the surrounding and acquire point clouds. LiDAR system 102 measures distance to a target by illuminating the target with pulsed laser beam and measuring the reflected pulses with a receiver. The laser beam used for LiDAR system 102 may be ultraviolet, visible, or near infrared. In some embodiments of the present disclosure, LiDAR system 102 may capture point clouds. As vehicle 100 moves along the trajectory, LiDAR system 102 may continuously capture data. Each set of scene data captured at a certain time range is known as a data frame.

Figure 2A:
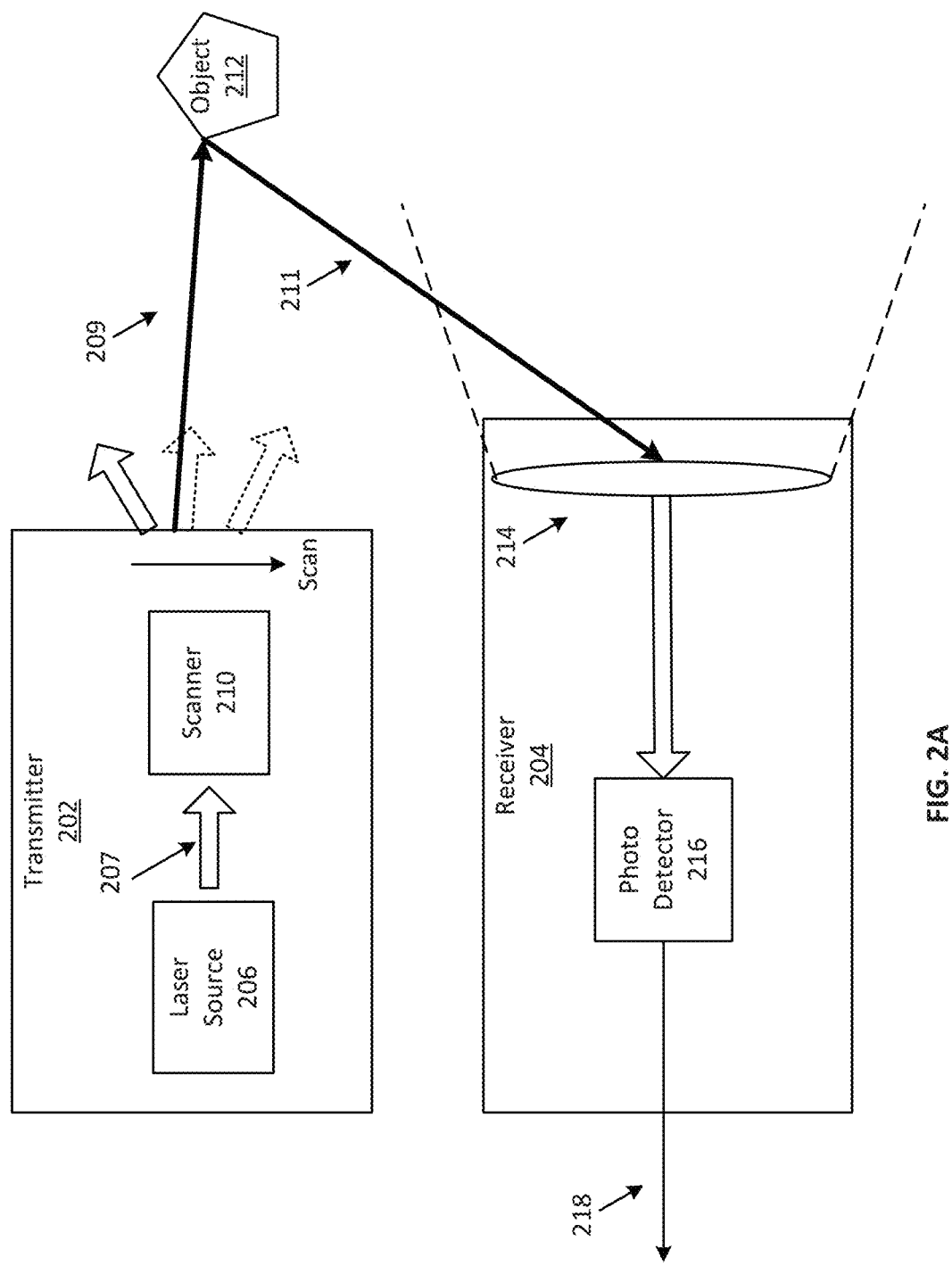
FIG. 2A illustrates a block diagram of an exemplary LiDAR system having a transmitter with a scanner, according to embodiments of the disclosure.

FIG. 2A illustrates a block diagram of an exemplary LiDAR system 102 having a transmitter 202 with a scanner 210, according to embodiments of the disclosure. LiDAR system 102 may include transmitter 202 and a receiver 204. Transmitter 202 may emit laser beams within a scan angle. Transmitter 202 may include one or more laser sources 206 and scanner 210. As described below in detail, scanner 210 may include a micromachined mirror assembly (not shown) having reflective layers on both sides (e.g., one a light-reflecting surface/side where light is reflected and the surface/side opposite of the light-reflecting surface/side) to compensate the curvature variation of the micro mirror under different temperatures.

The micromachined mirror assembly may include a flat, electrostatically actuated rotatable micro-mirror (or rotatable mirror) used to scan a wide field of view with a single or multiple light sources. In order to improve the optical gain, the size of the rotatable mirror is maximized without sacrificing optical surface evenness for long range resolution. The entire structure (e.g., with one or more layers) should have little or no stress gradient along a direction perpendicular to a top surface of the rotatable mirror. If the rotatable mirror includes multiple layers and/or materials stacked to reflect light, the structure of the rotatable mirror should be mirrored (e.g., having the same layers, arrangement, and materials on both sides of the rotatable mirror) to cancel out the stress derived from any mismatch in the coefficients of thermal expansion of different materials/layers. The main purpose of this layer/material configuration is to create a base for an even light-reflecting surface while providing target mechanical properties such as large deflection angle when rotated by the micro-mirror hinges, minimal dynamic deformation on the light-reflecting surface, and sufficiently high resonant frequency to achieve target operating frequency. For optical reflectivity, the rotatable mirror has layers of materials with same optically reflective material on both the top and bottom surfaces to eliminate temperature sensitivity of the rotatable mirror. This configuration can cancel out the stress mismatch throughout the layers. Thus, both surfaces of the rotatable mirror expand and contract by an equal amount as temperature changes, keeping the divergence of the rotatable mirror consistent throughout its operating temperatures. In some embodiments, when the area of the light-reflecting surface increases, the disclosed structure and method can be employed to maintain a zero or low stress throughout the layers/materials of the rotatable mirror, thus maintaining the evenness of the light-reflecting surface.

As part of LiDAR system 102, transmitter 202 can sequentially emit a stream of pulsed laser beams in different directions within its scan angle, as illustrated in FIG. 2A. Laser source 206 may be configured to provide a laser beam 207 (referred to herein as "native laser beam") in a respective incident direction to scanner 210. In some embodiments of the present disclosure, laser source 206 may generate a pulsed laser beam in the ultraviolet, visible, or near infrared wavelength range.

In some embodiments of the present disclosure, laser source 206 is a pulsed laser diode (PLD). A PLD may be a semiconductor device similar to a light-emitting diode (LED) in which the laser beam is created at the diode's junction. In some embodiments of the present disclosure, a PLD includes a PIN diode in which the active region is in the intrinsic (I) region, and the carriers (electrons and holes) are pumped into the active region from the N and P regions, respectively. Depending on the semiconductor materials, the wavelength of incident laser beam 207 provided by a PLD may be smaller than 1,100 nm, such as 405 nm, between 445 nm and 465 nm, between 510 nm and 525 nm, 532 nm, 635 nm, between 650 nm and 660 nm. 670 nm, 760 nm, 785 nm, 808 nm, or 848 nm.

Scanner 210 may be configured to emit a laser beam 209 to an object 212 in a first direction. Object 212 may be made of a wide range materials including, for example, non-metallic objects, rocks, rain, chemical compounds, aerosols, clouds and even single molecules. The wavelength of laser beam 209 emitted may vary based on the composition of object 212. At each time point during the scan, scanner 210 may emit laser beam 209 to object 212 in a direction within the scan angle by rotating the micromachined mirror assembly as the incident angle of incident laser beam 207 may be fixed. In some embodiments of the present disclosure, scanner 210 may also include optical components (e.g., lenses, mirrors) that can focus pulsed laser light into a narrow laser beam to increase the scan resolution and range of object 212.

As part of LiDAR system 102, receiver 204 may be configured to detect a returned laser beam 211 returned from object 212 in a different direction. Receiver 204 can collect laser beams returned from object 212 and output electrical signal reflecting the intensity of the returned laser beams. Upon contact, laser light can be reflected by object 212 via backscattering, such as Rayleigh scattering, Mie scattering, Raman scattering, and fluorescence. As illustrated in FIG. 2A, receiver 204 may include a lens 214 and a photodetector 216. Lens 214 may be configured to collect light from a respective direction in its field of view (FOV). At each time point during the scan, returned laser beam 211 may be collected by lens 214. Returned laser beam 211 may be returned from object 212 and have the same wavelength as laser beam 209.

Photodetector 216 may be configured to detect returned laser beam 211 returned from object 212. Photodetector 216 may convert the laser light (e.g., returned laser beam 211) collected by lens 214 into an electrical signal 218 (e.g., a current or a voltage signal). The current is generated when photons are absorbed in the photodiode. In some embodiments of the present disclosure, photodetector 216 may include avalanche photodiode (APD), such as a single photon avalanche diode (SPAD), a SPAD array, or a silicon photo multiplier (SiPM).

Figure 2B:
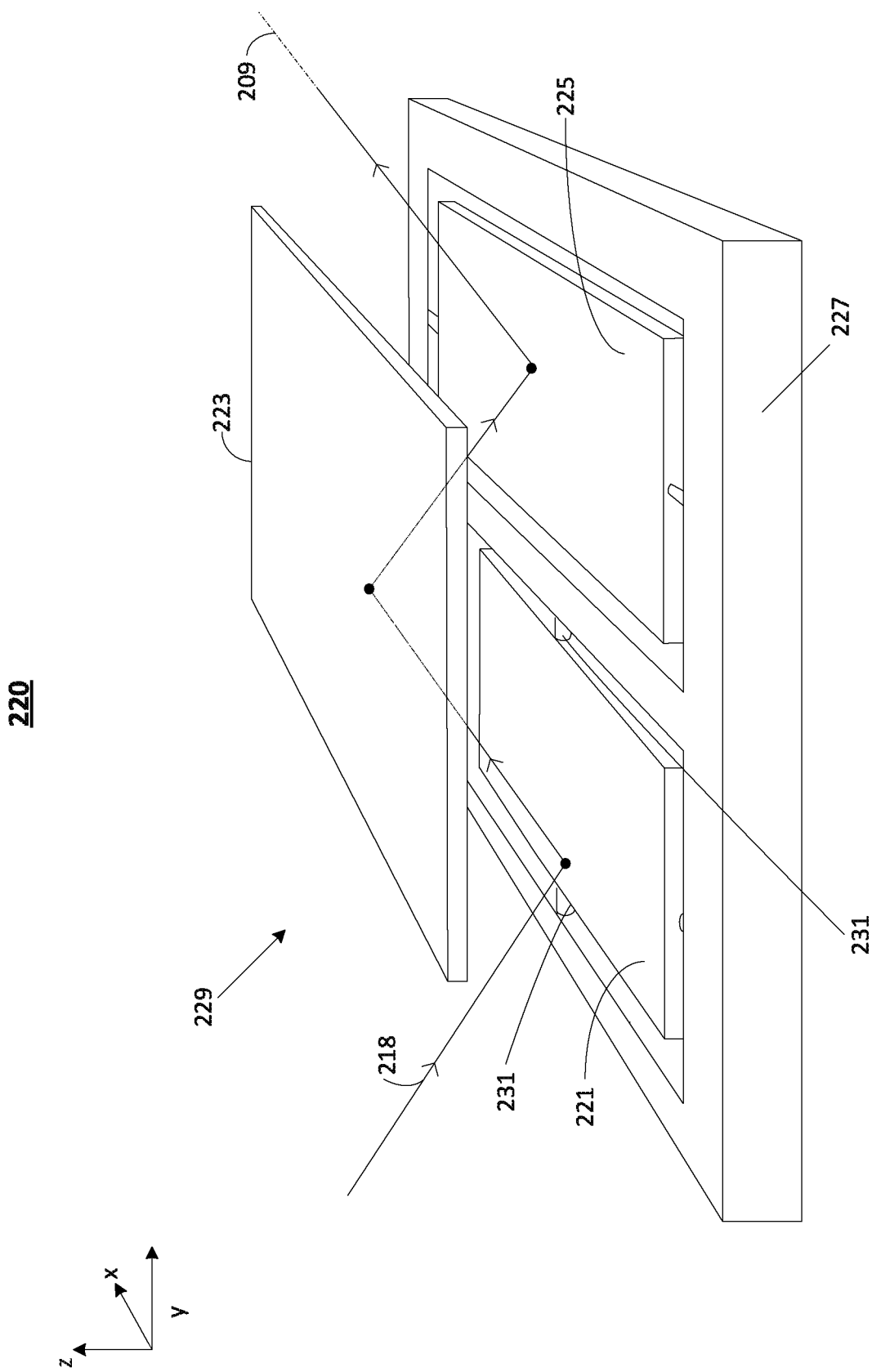
FIG. 2B illustrates a working environment of a micromachined mirror assembly, according to embodiments of the disclosure.

FIG. 2B illustrates a working environment 220 of a micromachined mirror assembly 229, according to embodiments of the present disclosure. Micromachined mirror assembly 229 may include one or more rotatable mirrors. For ease of illustration, two rotatable mirrors 221 and 225 are shown in FIG. 2B. In an example, rotatable mirrors 221 and 225 can be microfabricated in a semiconductor substrate 227. Rotatable mirrors 221 and 225 may be MEMS devices formed in and connected with semiconductor substrate 227 through hinges, e.g., 231. Micromachined mirror assembly 229 may also include a stationary mirror 223 position above rotatable mirrors 221 and 225 along the vertical direction (e.g., the z axis). Rotatable mirror 221 may receive collimated bundled of pulsed light 218 from, e.g., a collimator lens in scanner 210, reflect pulsed light 218 towards stationary mirror 223, which can reflect pulsed light 218 towards rotatable mirror 225. Rotatable mirror 225 can reflect pulsed light 218 received from stationary mirror 223 along an output projection path and emit it as laser beam 209.

FIG. 3 illustrates a cross-sectional view of an exemplary rotatable mirror 300 along the y-z plane, according to some embodiments of the present disclosure. Rotatable mirror 300 may be a component of a micromachined mirror assembly (e.g., element 229 of FIG. 2B), functioning in a same or similar environment as environment 220. Rotatable mirror 300 may be positioned in the same or similar locations as rotatable mirrors 221 and 225, as shown in FIG. 2B. Rotatable mirror 300 may reflect light (e.g., pulsed light) the same way or similarly as rotatable mirrors 221 and 225, as described in FIG. 2B. As shown in FIG. 3, pulsed light 218 may be incident on a top surface of rotatable mirror 300 and be reflected towards another direction.

Rotatable mirror 300 may include a mirror-base layer 302, a reflective layer 304 over a top surface of mirror-base layer 302, and a reflective layer 306 over a bottom surface of mirror-base layer 302. Reflective layer 304 may include a material of sufficiently high reflectivity to light, such as metals. In some embodiments, reflective layer 304 includes one or more of aluminum and gold. Reflective layer 306 may include a material of at least nominally same thermal expansion coefficient, nominally same Young's modulus, and/or nominally same dimensions (e.g., thicknesses along the z axis and/or areas along the x-y plane, the x-direction being perpendicular to the y-z plane). In some embodiments, reflective layers 304 and 306 include a same metal material, and have same dimensions. Reflective layers 304 and 306 may be deposited by any suitable deposition methods such as one or more of physical vapor deposition process, chemical vapor deposition process, atomic layer deposition, electroplating, electrodeless plating, spin-coating, spray-coating, or a combination thereof.

In some embodiments, reflective layers 304 and 306 may undergo nominally same thermal expansion as temperature changes. Because reflective layers 304 and 306, positioned on opposite sides of mirror-base layer 302, are made of the same material and have nominally the same dimensions, the stress applied on mirror-base layer 302 from the top surface (e.g., by reflective layer 304) and the bottom surface (e.g., by reflective layer 306) may be nominally the same and may have opposite directions. The stress may thus be reduced or may cancel out. In some embodiments, the stress gradient of rotatable mirror 300 is sufficiently low or is equal to zero in reflective layers 304 and 306 and mirror-base layer 302 along the z axis. Rotatable mirror 300 can be less susceptible to curving and/or bowing caused by stress mismatch as a result of temperature change. The reflective top surface of rotatable mirror 300 can maintain its evenness as temperature fluctuates to allow laser beam 209 to scan at desired directions and/or have consistent divergence. In some embodiments, if the bottom surface of mirror-base layer 302 has different portions of which the top surfaces are positioned at different elevations, the total area of the top surfaces deposited with reflective layer 306 should be at least nominally the same as the area of the top surface deposited with reflective layer 304.

Figure 4A:
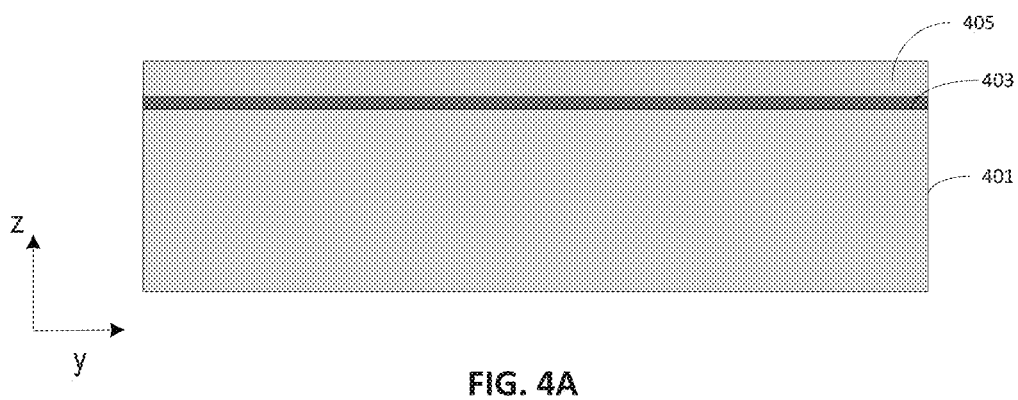
FIGS. 4A-4N each illustrates a cross-sectional view of an exemplary micromachined mirror assembly at a different stage of a fabrication process, according to embodiments of the disclosure.
Figure 4B:
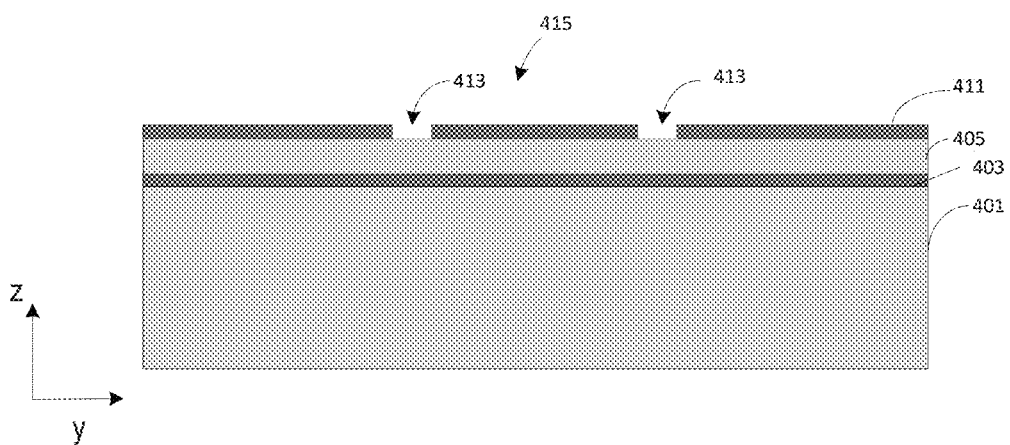
Figure 4C:
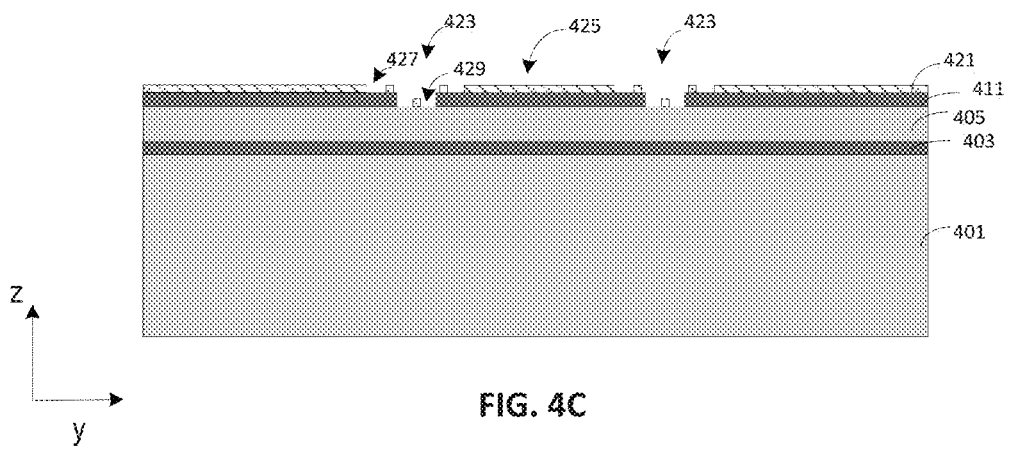
Figure 4D:
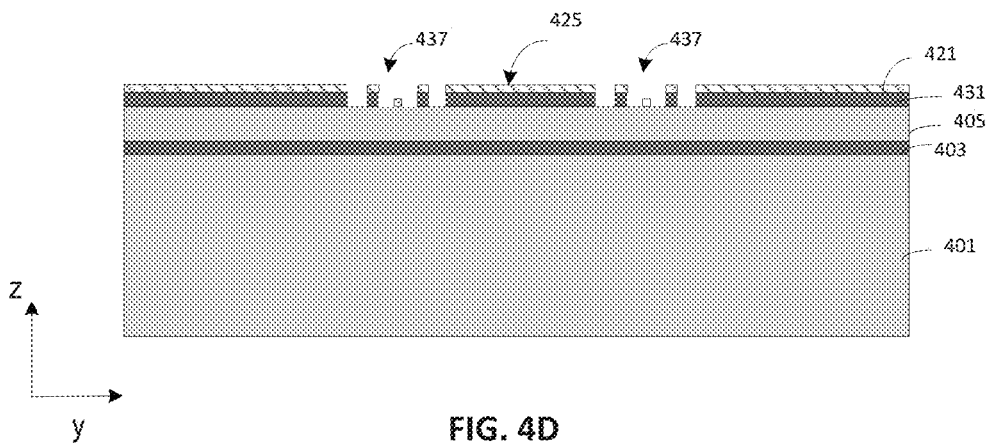
Figure 4E:
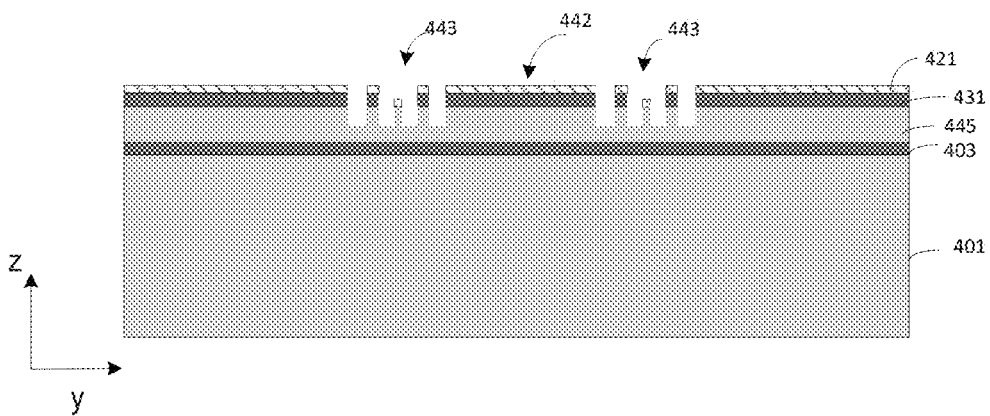
Figure 4F:
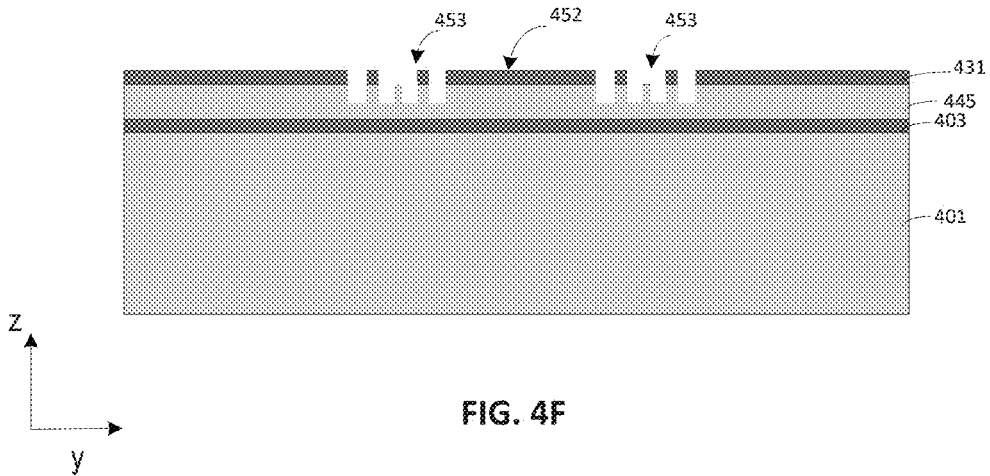
Figure 4G:
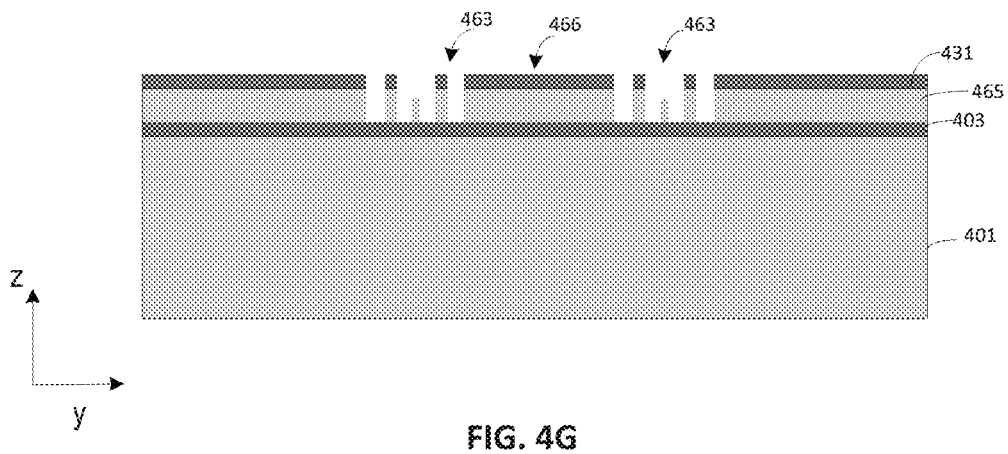
Figure 4H:
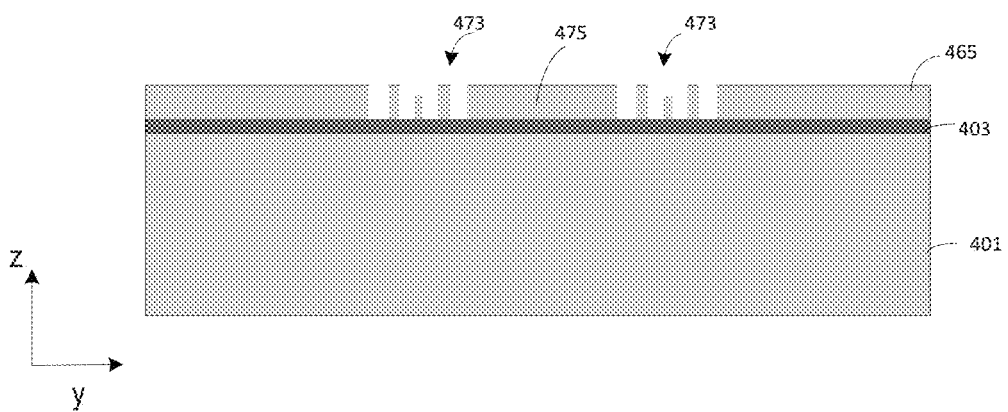
Figure 4I:
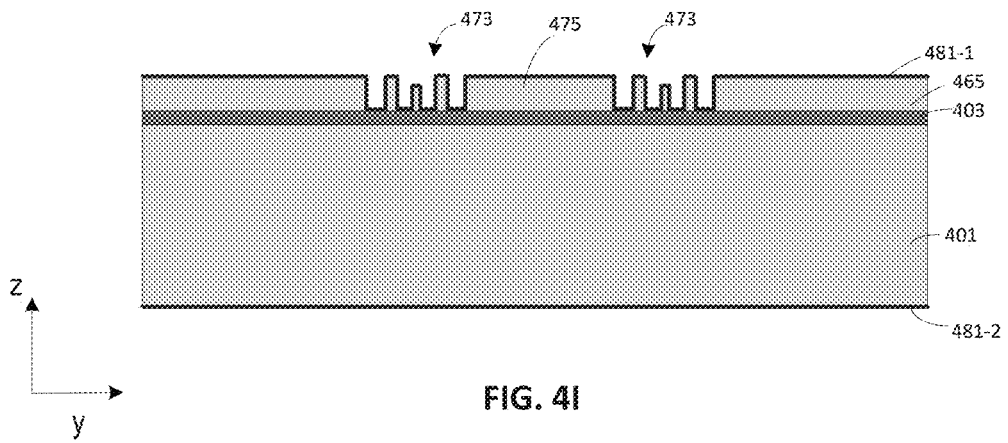
Figure 4J:
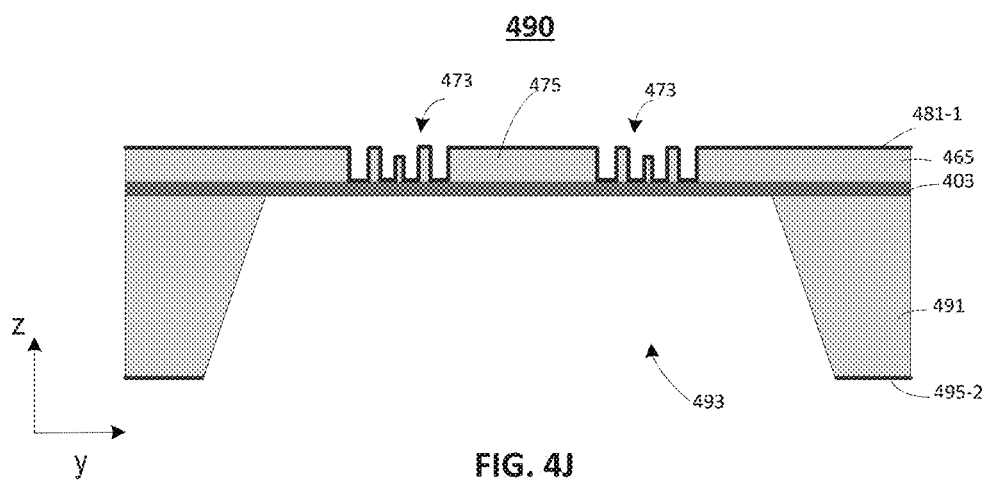
Figure 4K:
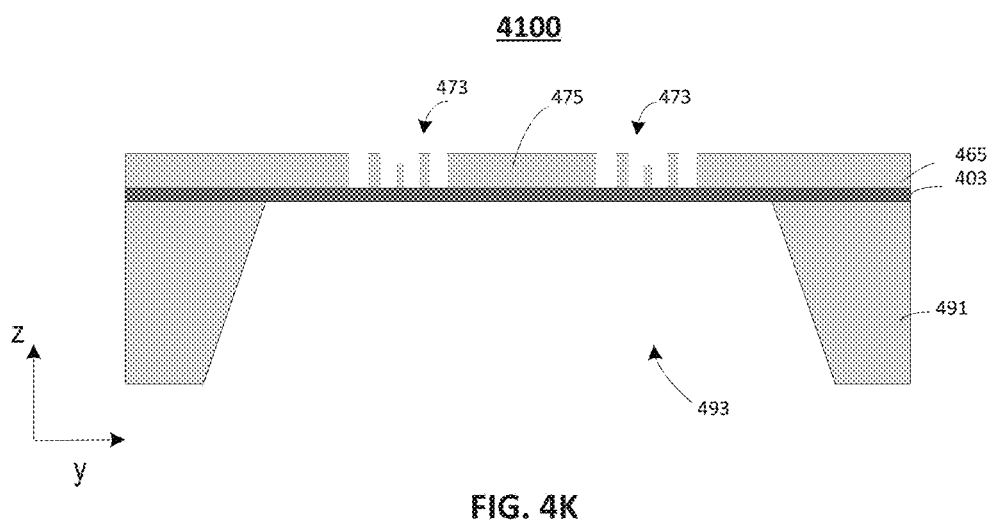
Figure 4L:
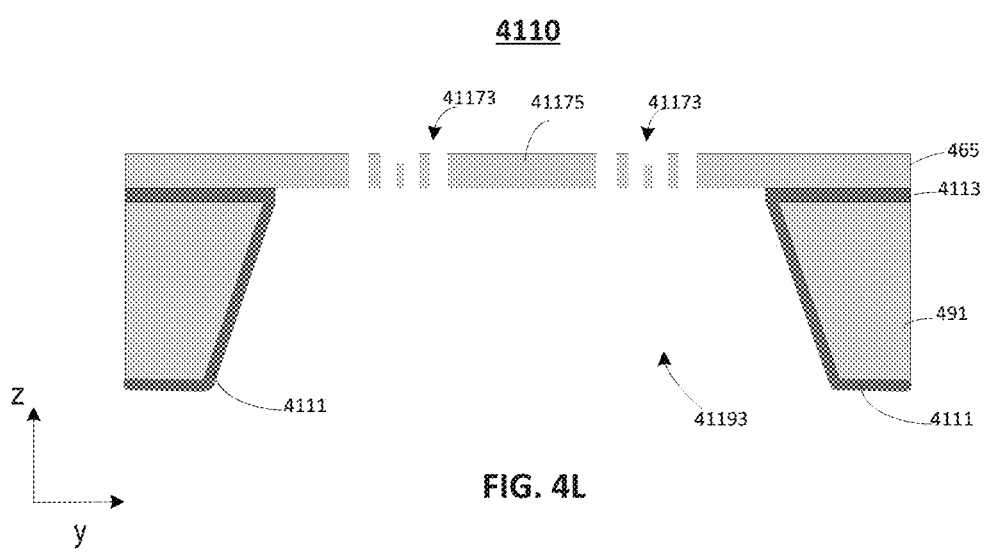
Figure 4M:
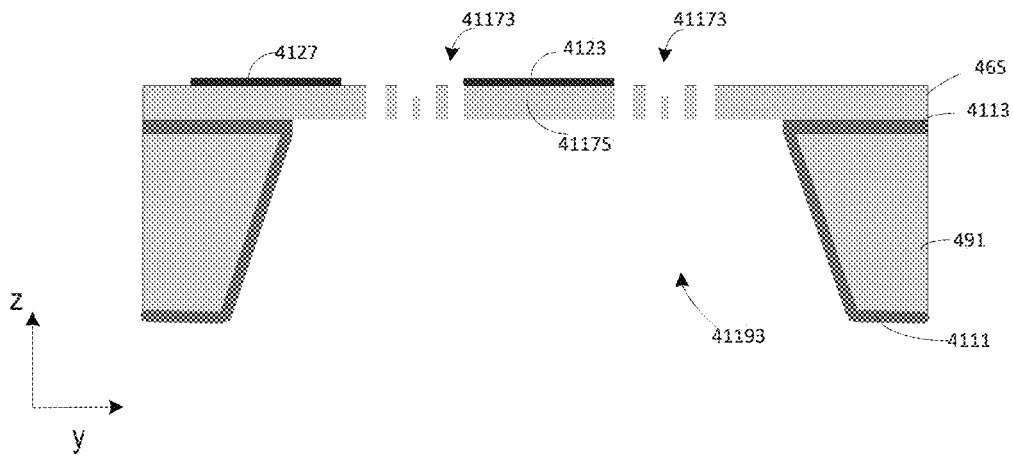
Figure 4N:
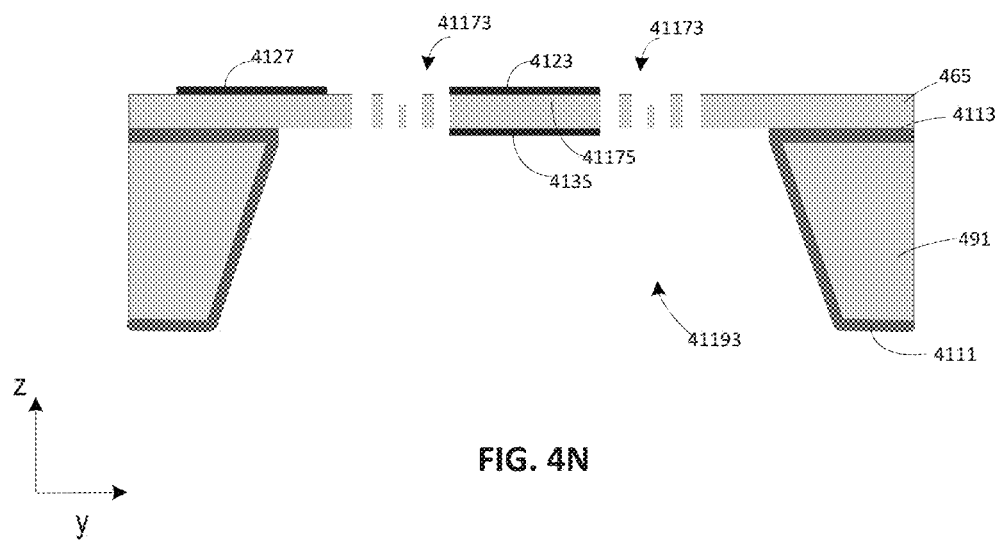
Figure 5A:
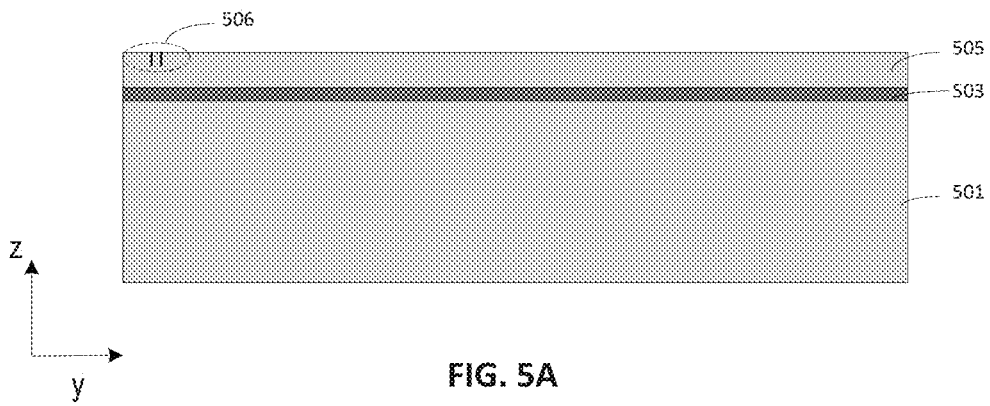
FIGS. 5A-5P each illustrates a cross-sectional view of another exemplary micromachined mirror assembly at a different stage of a fabrication process, according to embodiments of the disclosure.
Figure 5P:
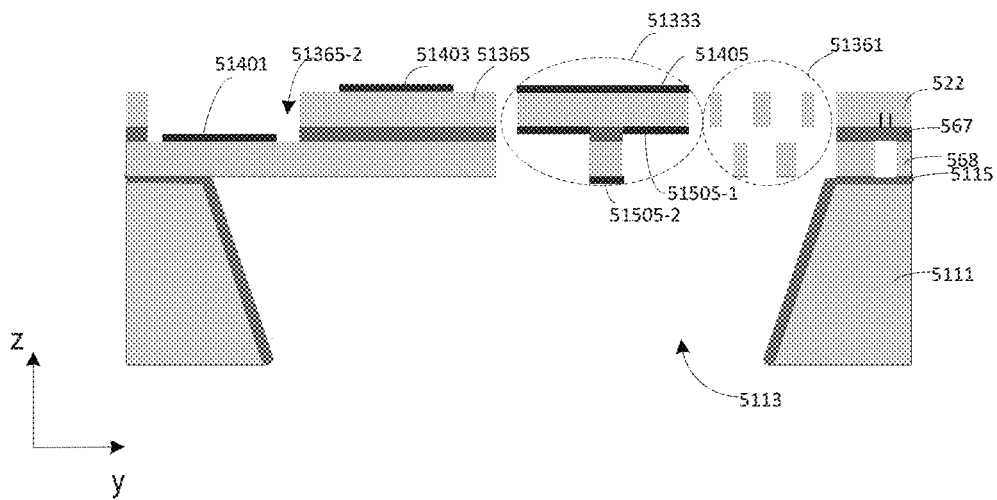
Figure 6A:
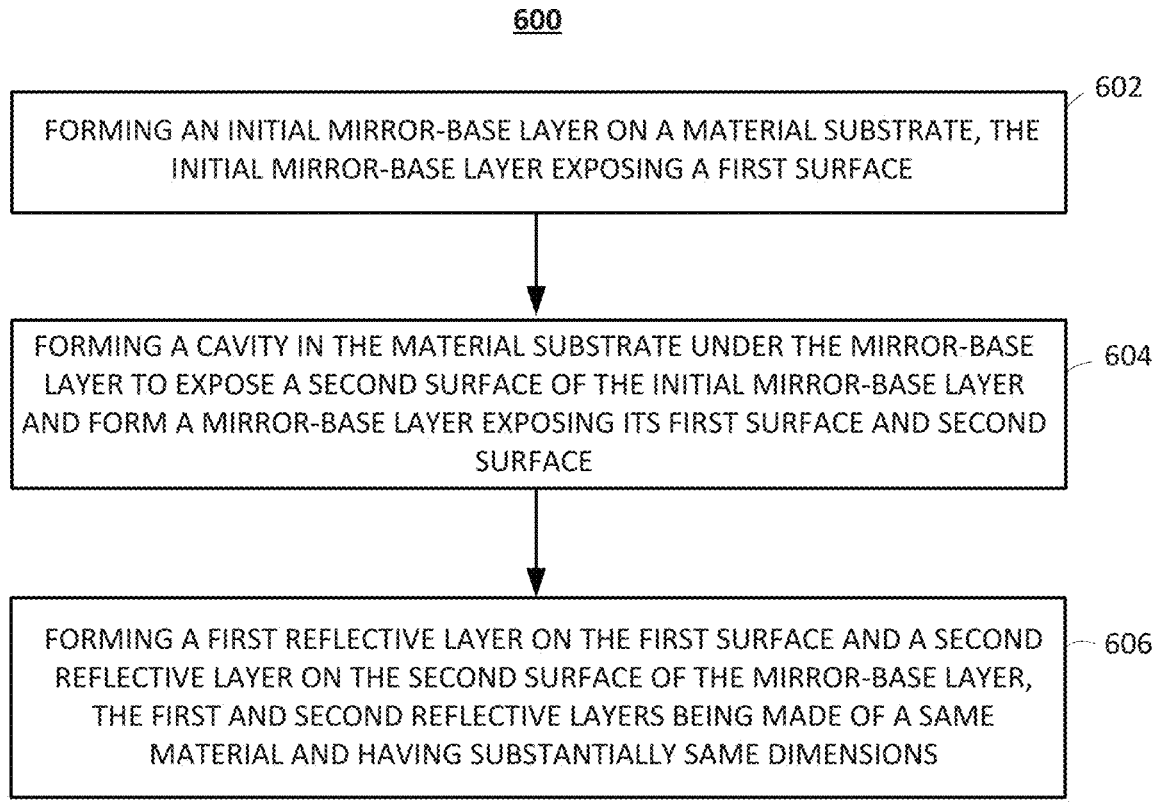
FIG. 6A illustrates a flow chart of an exemplary method for making a micromachined mirror assembly having reflective layers on top and bottom surfaces of a rotatable mirror, according to embodiments of the disclosure.

FIGS. 4A-4N illustrate cross-section views of an exemplary rotatory mirror at different stages of an exemplary fabrication process, according to embodiments of the present disclosure. FIG. 6A illustrates an exemplary process 600 of the fabrication process illustrated in FIGS. 4A-4N. FIGS. 5A-5P illustrate cross-section views of an exemplary rotatory mirror at different stages of an exemplary fabrication process, according to embodiments of the present disclosure.

Figure 6B:
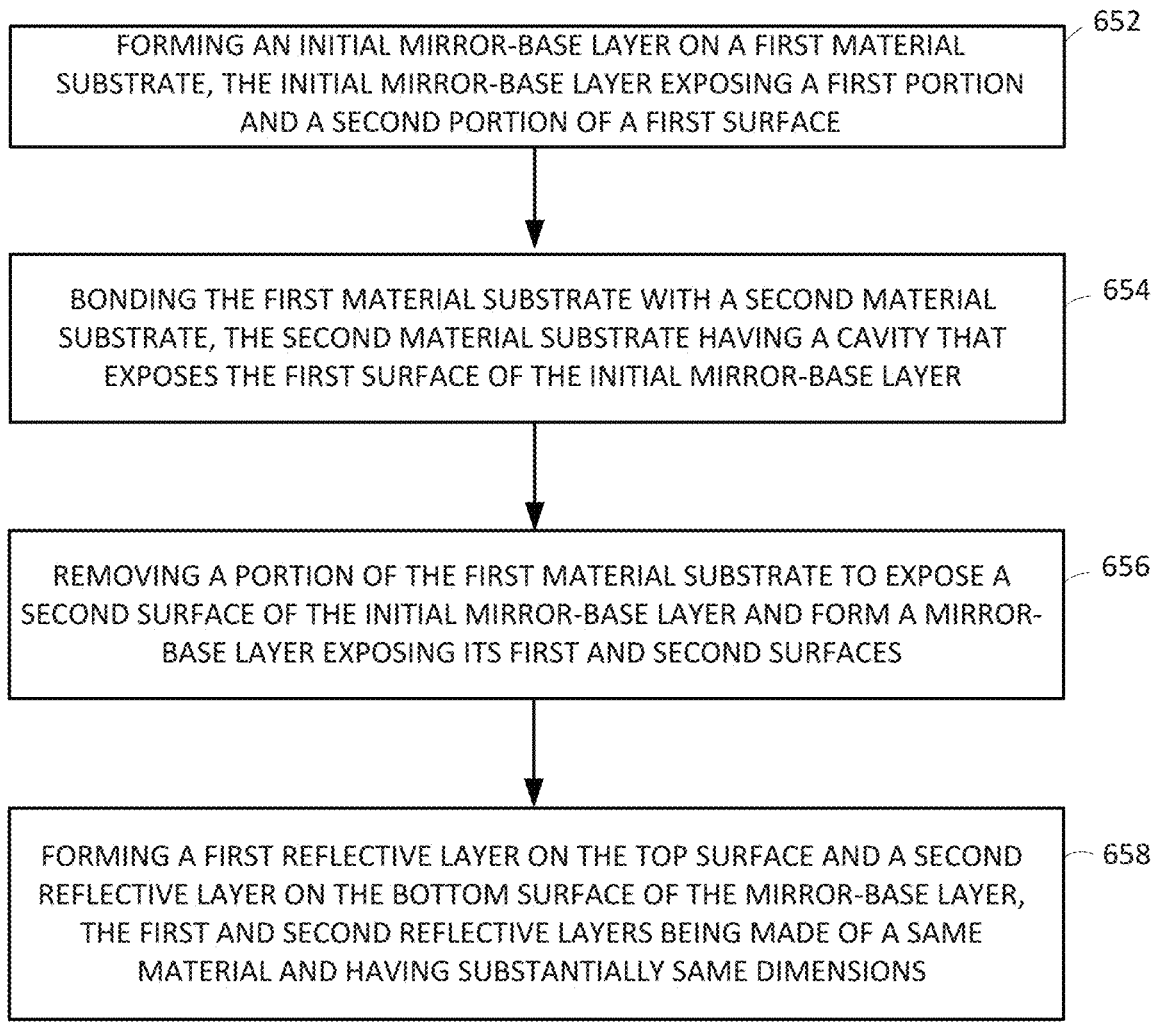
FIG. 6B illustrates a flow chart of an exemplary method for making another micromachined mirror assembly having reflective layers on top and bottom surfaces of a rotatable mirror, according to embodiments of the disclosure.

FIG. 6B illustrates an exemplary process 650 of the fabrication process illustrated in FIGS. 5A-5P. In the fabrication processes, other parts (e.g., hinge) of the micromachined mirror assembly may also be formed together with the respective rotatory mirror.

At the beginning of the fabrication process, an initial mirror-base layer can be formed on a material substrate. The initial mirror-base layer may expose a first surface (Step 602 of FIG. 6A). FIGS. 4A-4H illustrate corresponding structures.

As shown in FIG. 6A, an initial mirror-base layer 475 can be formed on the top surface of a material substrate 400 as provided in FIG. 4A. Initial mirror-base layer 475 may expose its first surface (e.g., top surface).

Starting from FIG. 4A, material substrate 400 can be provided. Material substrate 400 may include any suitable semiconductor structure and/or device that has a base material layer 405 (e.g., for forming a mirror) that is bonded, mounted, and/or deposited on a base substrate/structure 401. Base material layer 405 may have sufficient stiffness and evenness on the top surface and the back surface (e.g., along the z axis). Base substrate 401 may include a semiconductor material. In some embodiments, material substrate 400 may be a silicon on insulator (SOI) substrate that has a silicon layer as base material layer 405 over an insulator layer 403, which is over a base substrate 401 that contains silicon.

Proceeding to FIG. 4B, a first patterned mask layer 411 may be formed over the top surface of material substrate 400 to define a first mirror-forming pattern 415 and first hinge-forming patterns 413 over base material layer 405, as depicted by structure 410. First mirror-forming pattern 415 may define an area for subsequently forming a rotatable mirror (e.g., 300 shown in FIG. 3 or 221 and 225 shown in FIG. 2B). In some embodiments, first hinge-forming patterns 413 are positioned on both sides (e.g., along the y axis) of first mirror-forming pattern 415 for subsequently forming hinges (e.g., 231 shown in FIG. 2B) that connect the rotatable mirror and the rest of material substrate 400. In some embodiments, first hinge-forming pattern 413 includes an opening/trench that exposes a portion of base material layer 405, and first mirror-forming pattern 415 covers a portion of base material layer 405.

In some embodiments, first patterned mask material layer 411 is formed by patterning a first mask layer deposited over base material layer 405 by a suitable patterning process, such as a photolithography process and an etching process (e.g., wet etch and/or dry etch). In some embodiments, the first mask layer includes silicon oxide.

Proceeding to FIG. 4C, a first patterned photoresist layer 421 may be formed over structure 410 to form a second mirror-forming pattern 425, as depicted by structure 420. In some embodiments, second hinge-forming patterns 423 may also be formed by first patterned photoresist layer 421. First patterned photoresist layer 421 may form one or more openings 427 that expose portions of first patterned mask layer 411 on both sides of first hinge-forming pattern 413, and one or more openings 429 in first hinge-forming patterns 413 that expose portions of base material layer 405. First patterned photoresist layer 421 may be formed by coating a photoresist layer over first mirror-forming pattern 415 and first hinge-forming patterns 413, and patterning the photoresist layer by a photolithography process.

Proceeding to FIG. 4D, a first etching process may be performed to remove portions of first patterned mask layer 411 exposed by first patterned photoresist layer 421 to form openings 437 that expose portions of base material layer 405. A second patterned mask layer 431 may be formed, as depicted by structure 430. In some embodiments, first patterned photoresist layer 421 may be used as an etch mask for the etching process. Any suitable selective etching process (e.g., dry and/wet etch) that selectively etches first patterned mask layer 411 over base material layer 405, may be performed. In some embodiments, base material layer 405 may be an etch-stop layer to allow the etching of first patterned mask layer 411 to stop on the top surface of base material layer 405.

Proceeding to FIG. 4E, portions of base material layer 405 may be removed to form a third mirror-forming pattern 442, as depicted by structure 440. In some embodiments, second openings 443 may also be formed by the same etching process. In some embodiments, the removal of portions base material layer 405 forms a partially-patterned base material layer 445. A bottom surface of second opening 443 may be above the top surface of insulator layer 403 and exposes a portion of partially-patterned base material layer 445. A suitable anisotropic etching process may be performed, e.g., using first patterned photoresist layer 421 as the etch mask, to directionally remove portions of base material layer 405 along the z axis. In some embodiments, the etching time may be controlled to end the etching process before the bottom surface of second opening 443 reaches insulator layer 403.

Proceeding to FIG. 4F, first patterned photoresist layer 421 may be removed to form partial-initial mirror-forming structure 452, as depicted by structure 450. In some embodiments, partial-initial hinge-forming structures 453 are exposed by the same process. Any suitable process, e.g., ashing process, may be performed to remove first patterned photoresist layer 421. Proceeding to FIG. 4G, portions of partially-patterned base material layer 445 may be removed to expose insulator 403 and form second partial-initial mirror-forming structure 466 over insulator layer 403, as depicted by structure 460. In some embodiments, second partial-initial hinge-forming structures 463 may be formed over insulator layer 403 by the same etching process. The removal of the portions of partially-patterned base material layer 445 may accordingly form patterned base material layer 465. In some embodiments, the etching process includes a suitable anisotropic etching process (e.g., wet and/or dry etch) using second patterned mask layer 431 as the etch mask. Proceeding to FIG. 4H, second patterned mask layer 431 may be removed and an initial mirror-base layer 475 may be formed, as depicted by structure 470. In some embodiments, initial hinge structures 473 may also be formed over insulator layer 403. Initial mirror-base layer 475 may expose its top surface (e.g., first surface). Any suitable etching process, such as a wet etch and/or a dry etch, may be performed on second partial-initial mirror-forming structure 466 and second partial-initial hinge-forming structures 463 to remove second patterned mask layer 431.

Referring back to FIG. 6A, after the formation of initial mirror-base layer, a cavity may be formed in the material substrate under the mirror-base layer to expose a second surface of the initial mirror-base layer, and form a mirror-base layer that exposes its first and second surfaces (Step 604 of FIG. 6A). FIGS. 4I-4L illustrate corresponding structures.

As shown in FIG. 4I, hard mask material layers 481-1 and 481-2 may respectively be deposited over a top surface and a bottom surface of structure 470, as depicted by structure 480. Hard mask material layer 481-1 may cover initial hinge structure 473 and initial mirror-base layer 475 and prevent them from damages during the subsequent formation of the cavity. In some embodiments, hard mask material layers 481-1 and 481-2 may have sufficient thickness to protect the structures covered from being damaged in the formation (e.g., etching of base substrate 401) of the cavity. In some embodiments, hard mask material layers 481-1 and 481-2 each includes silicon nitride and can be formed by any suitable deposition methods such as chemical vapor deposition (CVD), physical vapor deposition (PVD), atomic layer deposition (ALD), or a combination thereof.

Proceeding to FIG. 4J, hard mask material layer 481-2 be patterned to expose a portion of base substrate 401, and the exposed portion of base substrate 401 may be removed until a bottom surface of insulator layer 403 is exposed to form an initial cavity 493, as depicted by structure 490. Hard mask material layer 481-2 may be patterned by, e.g., forming a patterned photoresist layer 495-2 that has an opening exposing a portion of hard mask material layer 481-2. In some embodiments, a location of the opening corresponds to a location of initial mirror-base layer 475 (e.g., a projection of the opening overlaps and/or covers the projection of initial mirror-base layer 475 along the z axis). Further, a suitable etching process may be performed to remove the exposed portion of base substrate 401 using patterned hard mask layer 495-2 as the etch mask until the bottom surface of insulator layer 403 is exposed. In some embodiments, an anisotropic etch (e.g., a wet etch using KOH as the etching agent) is performed to remove the exposed portion of base substrate 401 and form initial cavity 493 that exposes the bottom surface of insulator layer 403. In some embodiments, initial cavity 493 has a trapezoid cross-sectional shape along the z-y plane. A patterned base substrate 491 may be formed from the etching of base substrate 401. Proceeding to FIG. 4K, hard mask material layer 481-1 and patterned hard mask layer 495-2 may be removed, e.g., by a suitable etching process (e.g. dry and/or wet etch), as depicted by structure 4100.

Proceeding to FIG. 4L, an insulating layer may be formed to cover at least the sidewall of initial cavity 493 and to connect with insulator layer 403. The portion of insulator layer 403 under initial mirror-base layer 475 and initial hinge structures 473 may be removed to expose the bottom surfaces of initial mirror-base layer 475 and initial hinge structures 473. A mirror-base layer 41175 and hinge structures 41173 may be formed. The remaining portion of insulator layer 403 may form an insulator portion 4113, which is connected with another insulator portion 4111 formed by the deposition of the insulating layer. Cavity 41193 may be formed. Mirror-base layer 41175 may expose its top (e.g., first) surface and bottom (e.g., second) surface. Insulator portions 4111 and 4113 may insulate patterned base substrate 491 from any conductive material in the subsequent formation of the rotatable mirror.

Any suitable deposition processes, such as CVD, PVD, and/or ALD, may be performed to form insulator portion 4111. Any suitable etching process, such as dry and/or wet etch, may be performed to remove the portion of insulator layer 403 under initial mirror-base layer 475 and initial hinge structures 473 and any insulator material deposited on insulator layer 403 in the formation of insulator portion 4111. In some embodiments, insulator portion 4111 includes a dielectric material such as silicon oxide.

Referring back to FIG. 6A, after the formation of cavity and mirror-base layer, a first reflective layer and a second reflective layer may respectively be formed on the first and second surface of the mirror-base layer. The first and second reflective layers may be made of a same material and have nominally same dimensions (Step 606 of FIG. 6A). FIGS. 4M-4N illustrate corresponding structures. In some embodiments, the operation illustrated in FIG. 4M may be performed before or after the operation illustrated in FIG. 4N.

Proceeding to FIG. 4M, a first reflective layer 4123 may be deposited on a first (e.g., top) surface of mirror-base layer 41175, as depicted by structure 4120. First reflective layer 4123 may be deposited by any suitable deposition process such as CVD, PVD, ALD, electroplating, electrodeless plating, spin-coating, spray-coating, any other suitable process, or any combination thereof, and patterned using any suitable patterning process. In some embodiments, the deposition parameters, such as the temperature and rate, can be controlled to adjust or even remove the stress of the first reflective layer 4123. A thickness of first reflective layer 4123 can be controlled by the deposition parameters, such as the temperature, duration, rate, and cycles as well. In some embodiments one or more electrodes, e.g., an electrode 4127, may be formed by the same deposition process and patterning process.

Proceeding to FIG. 4N, a second reflective layer 4135 may be deposited on a second (e.g., bottom) surface of mirror-base layer 41175 to form a rotatable mirror, as depicted by structure 4130. Second reflective layer 4135 may be deposited, e.g., through cavity 41193, by any suitable deposition process such as CVD, PVD, ALD, electroplating, electrodeless plating, spin-coating, spray-coating, any other suitable process, or any combination thereof, and patterned using any suitable patterning process. Second reflective layer 4135 may have at least nominally same thermal expansion coefficient, nominally same Young's modulus, and nominally same dimensions (e.g., thickness along the z axis and area along the x-y plane). In some embodiments, first reflective layer 4123 and second reflective layer 4135 are made of a same metal material. In some embodiments, first reflective layer 4123 and second reflective layer 4135 are each made of one or more of aluminum and gold. In some embodiments, first reflective layer 4123 and second reflective layer 4135 each has a thickness of about 50 nm to about 100 nm.

In some embodiments, first reflective layer 4123 and second reflective layer 4135 each includes a same distributed Bragg reflector ("DBR"). The DBR may function independently or together with a metal layer over its top surface to reflect light. The DBR may include a plurality of alternating materials having varying reflective indices (e.g., higher reflective index and lower reflective index). In some embodiments, the DBR may include two or more layers arranged repetitively along the z axis. For example, the DBR may include a plurality of pairs of a first dielectric layer (e.g., silicon oxide) and a second dielectric layer (e.g., silicon nitride), arranged repetitively along the z axis. The thicknesses of the first dielectric layer and the second dielectric layer may be determined to cause periodic variation in an effective reflective index of the DBR. In an example, if the DBR consists of a first dielectric layer (e.g., with a reflective index of $n_1$) and a second dielectric layer (e.g., with a reflective index of $n_2$), the thickness of the first dielectric layer may be about $(\lambda/(4n_1))$ and the thickness of the second dielectric layer may be about $(\lambda/(4n_2))$, respectively, where $\lambda$ represents a central wavelength of the DBR. In some embodiments, the thicknesses of the first and second dielectric layers can be adjusted so that $\lambda$ is close to a vacuum wavelength of returned laser beam 211. In some embodiments, a total thickness of the DBR is determined based on a desired reflectivity of the DBR. For example, a number of first dielectric layer/second dielectric layer pair may be determined so that the DBR has a sufficiently high reflectivity (e.g., greater than 95%). The DBR may be formed by any suitable fabrication processes, e.g., alternatingly depositing the first and the second dielectric layers over the first and second surfaces of mirror-base layer 41175 by CVD, PVD, ALD, etc.

FIG. 6B illustrates another exemplary process 650 to form a rotatable mirror with reflective layers on both top and bottom surfaces to reduce and/or cancel out stress caused by temperature change. FIGS. 5A-5P illustrates corresponding structures at different stages of the process illustrated by FIG. 6B.

At the beginning of process, an initial mirror-base layer can be formed on a first material substrate (Step 652 of FIG. 6B). The initial mirror-base layer can expose a first portion and a second portion of its first surface. FIGS. 5A-5G illustrate corresponding structures 500-560.

Starting from FIG. 5A, a first material substrate 500 may be provided. In some embodiments, first material substrate 500 is similar to first material substrate 400 illustrated in FIG. 4A. For example, first material substrate 500 may be a SOI substrate and include a base material layer 505 over an insulator layer 503, which is over a base substrate 501. In some embodiments, base material layer 505 includes silicon, insulator layer 503 includes silicon oxide, and base substrate 501 includes silicon. First material substrate 500 may be different from first material substrate 400 by having an alignment mark 506 formed in base material layer 505. Alignment mark 506 may be used for aligning material substrate 500 with another structure during a bonding process to form a rotatable mirror.

Figure 5B:
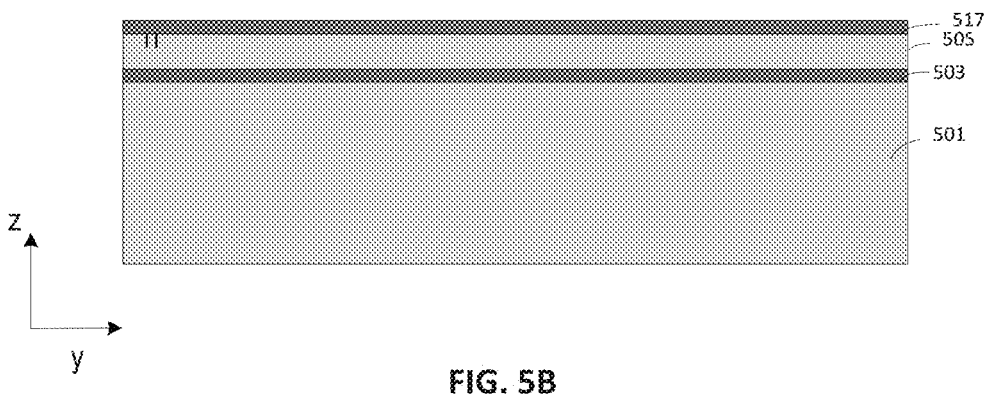

Proceeding to FIG. 5B, a bonding layer 517 may be deposited over base material layer 505, as depicted by structure 510. In some embodiments, bonding layer 517 covers alignment mark 506 and includes silicon oxide. Bonding layer 517 can be deposited by any suitable deposition methods such as PVD, CVD, and/or ALD.

Figure 5C:
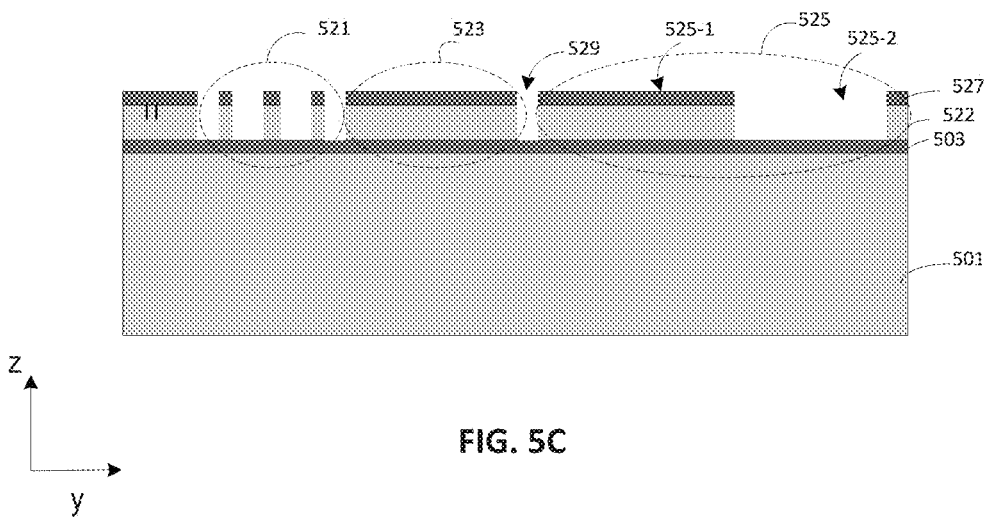

Proceeding to FIG. 5C, a first mirror-forming structure 523 may be formed on insulator layer 503, as depicted by structure 520. In some embodiments, a first hinge-forming structure 521 and a first electrode-forming structure 525 may be formed on insulator layer 503. In some embodiments, first electrode-forming structure 525 includes electrode-forming sub-structures 525-1 and 525-2 for forming different electrodes in subsequent processes. In some embodiments, first mirror-forming structure 523 and first electrode-forming structure 525 may be separated by an opening/trench 529. First mirror-forming structure 523, first hinge-forming structure 521, and first electrode-forming structure 525 may each include a pattern that has a portion of patterned bonding layer 527 over a portion of a patterned base material layer 522 on insulator layer 503.

Structure 520 may be formed by patterning structure 510 using any suitable patterning methods. For example, a patterned photoresist layer may be formed over bonding layer 517. The patterned photoresist layer may include openings that expose portions of bonding layer 517 for the formation of first hinge-forming structure 521, opening/trench 529, and electrode-forming sub-structure 525-2. A suitable etching process (e.g., wet and/or dry etch) may be performed on remove portions of bonding layer 517 and portions of base material layer 505 under the exposed portions of bonding layer 517 until insulator layer 503 is exposed. First mirror-forming structure 523, first hinge-forming structure 521, and first electrode-forming structure 525, patterned bonding layer 527, and patterned base material layer 522 can be formed on the top surface of structure 520.

Figure 5D:
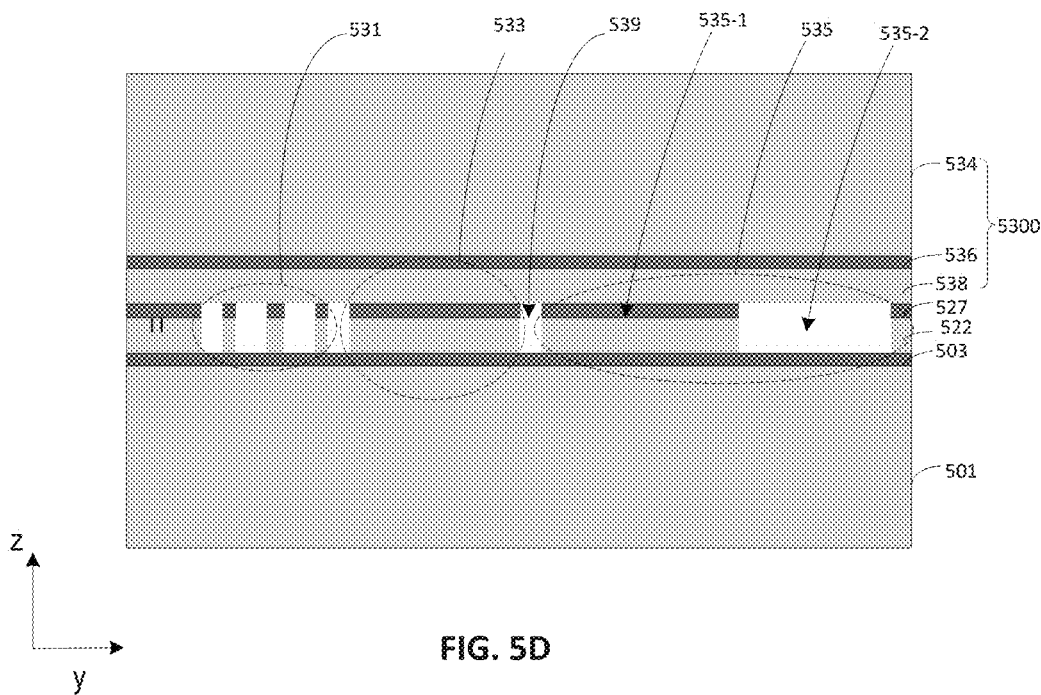

Proceeding to FIG. 5D, another material substrate 5300 may be bonded onto the top surface of structure 520 to form a second mirror-forming structure 533, as depicted by structure 530. In some embodiments, a second hinge-forming structure 531 and a second electrode-forming structure 535 are also formed by the bonding process. In some embodiments, other material substrate 5300 includes a SOI substrate that has a base substrate 534, an insulator layer 536, and a base material layer 538. In some embodiments, other material substrate 5300 may be nominally the same as material substrate 500.

In some embodiments, base material layer 538 of other material substrate 5300 may be bonded with patterned bonding layer 527 so that base substrate 534 is on top of base material layer 538. The bonding can form second mirror-forming structure 533, second hinge-forming structure 531, and second electrode-forming structure 535, which includes second electrode-forming sub-structures 535-1 and 535-2. Second mirror-forming structure 533 may be separated by opening/trench 539 formed by the bonding process. In some embodiments, pressure and/or heat may be applied on structure 530 to bond material substrate 5300 onto structure 520.

Figure 5E:
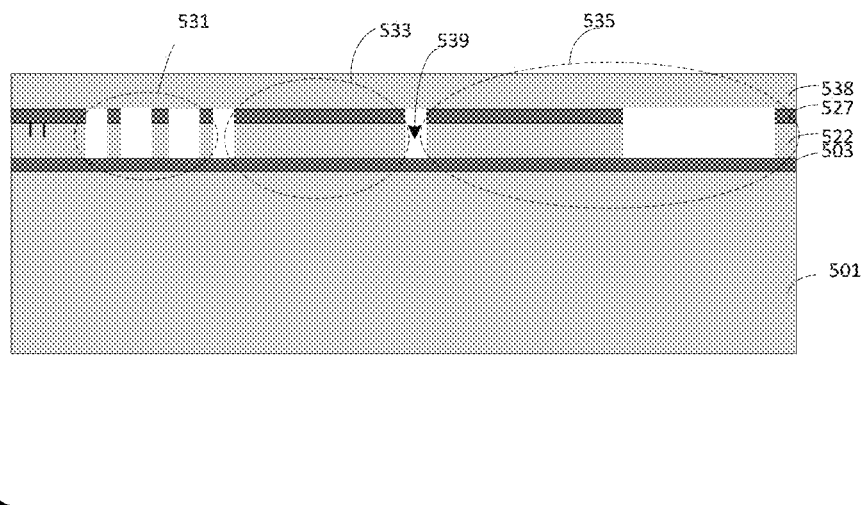

Proceeding to FIG. 5E, a top portion of structure 530 may be removed to retain a bottom portion 538 of structure 530 over patterned bonding layer 527, as depicted by structure 540. In some embodiments, the thickness of bottom portion 538 along the z axis may be determined based on the final structure of the rotatable mirror such as the elevation difference between the top surfaces of a first and a second portion of the first surface of the rotatable mirror. In some embodiments, base substrate 534 and insulator layer 536 may be removed and a portion of base material layer 538 is retained. The removal of base substrate 534 and insulator layer 536 may include a chemical mechanical polishing (CMP) process and/or a recess etch.

Figure 5F:
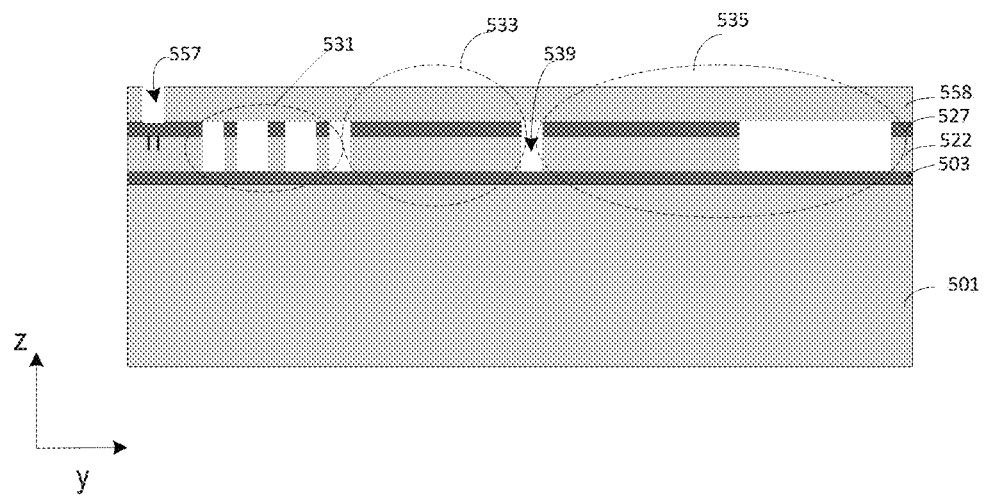

Proceeding to FIG. 5F, a portion of base material layer 538 can be removed to form an opening 557 that exposes a portion of patterned bonding layer 527 over alignment mark 506. A patterned base material layer 558 may be formed. In some embodiment, opening 557 may be formed by any suitable patterning process such as a photolithography process and an etching (dry and/or wet) process. In some embodiments, the etching includes a wet etch process that uses KOH as the etching agent.

Figure 5G:
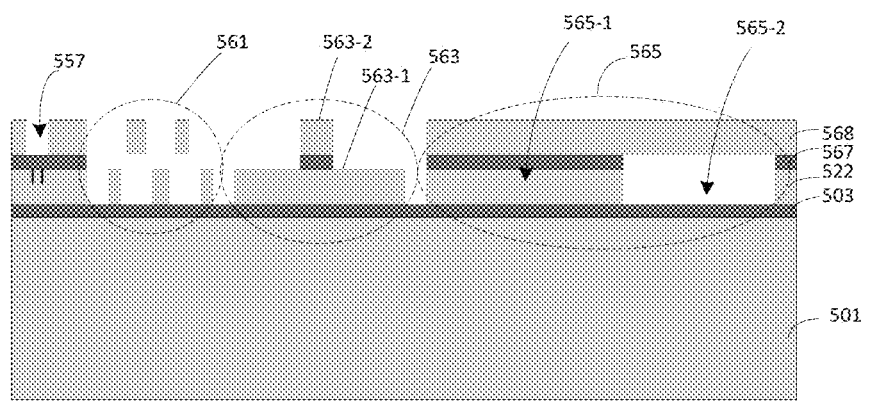

Proceeding to FIG. 5G, an initial mirror-base layer 563 may be formed on insulator layer 503, as depicted by structure 560. In some embodiments, an initial hinge-forming structure 561 and an initial electrode-forming structure 565, which includes initial electrode-forming sub-structures 565-1 and 565-2, may also be formed on insulator layer 503. In some embodiments, a suitable patterning process, such as a photolithography process and an etching (e.g., dry and/or wet etch) process is performed to remove portions of patterned base material layer 558 and portions of patterned bonding layer 527 to form initial mirror-base layer 563, initial hinge-forming structure 561, and initial electrode-forming structure 565, separated from one another on insulator layer 503. A second patterned base material layer 568 may be formed by the etching process. In some embodiments, initial hinge-forming structure 561 includes a plurality of portions of patterned base material layers 522 and second patterned base material layer 568.

In some embodiments, the patterning process may remove portions of patterned base material layer 558, a patterned insulator layer 567, and patterned base material layer 522 to form initial mirror-base layer 563. In some embodiments, initial mirror-base layer 563 includes a first portion 563-1 and a second portion 563-2. The top surface of first portion 563-1 may have a lower elevation than the top surface of second portion 563-2 along the z axis. The first surface of initial mirror-base layer 563 may include the top surfaces of first portion 563-1 and second portion 563-2 of initial mirror-base layer 563.

Referring back to FIG. 6B, after the formation of initial mirror-base layer, the first material substrate can be bonded with a second material substrate that has a cavity exposing the first surface of the initial mirror-base layer (Step 654 of FIG. 6B). FIGS. 5H-5M illustrate corresponding structures.

Figure 5H:
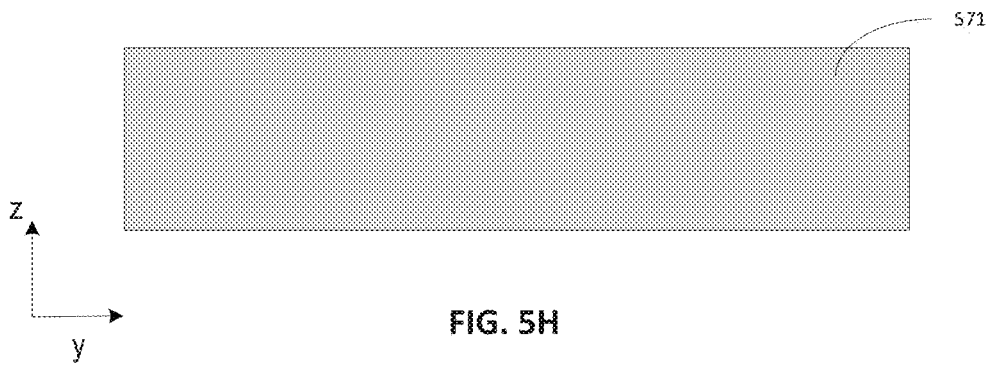
Figure 5I:
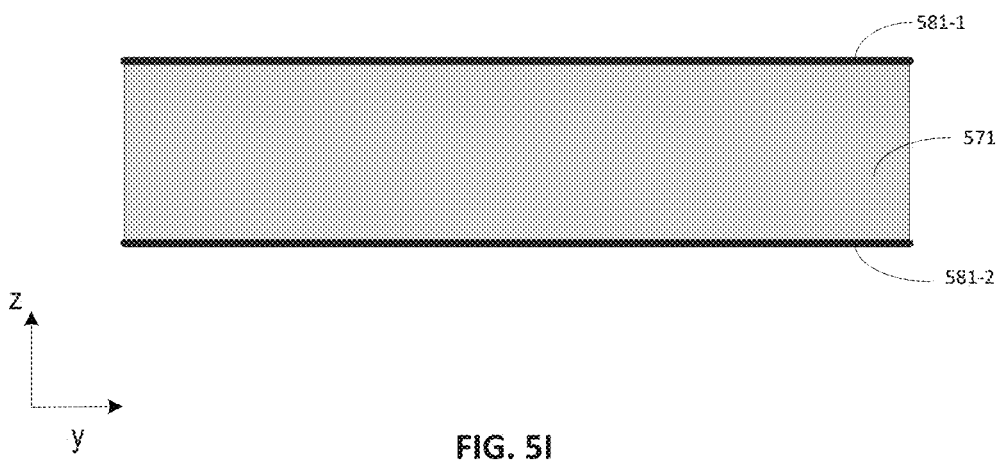

Proceeding to FIG. 5H, a second material substrate 570 may be provided. Second material substrate 570 may include a base substrate 571 that has a suitable material of sufficient stiffness and strength to support the first material substrate illustrated in FIGS. 5A-5G. In some embodiments, base substrate 571 includes silicon. Proceeding to FIG. 5I, hard mask material layers 581-1 and 581-2 may be deposited on top and bottom surfaces of base substrate 571. The material and deposition process of hard mask material layers 581-1 and 581-2 may be similar to hard mask material layers 481-1 and 481-2. Details are not repeated herein.

Figure 5J:
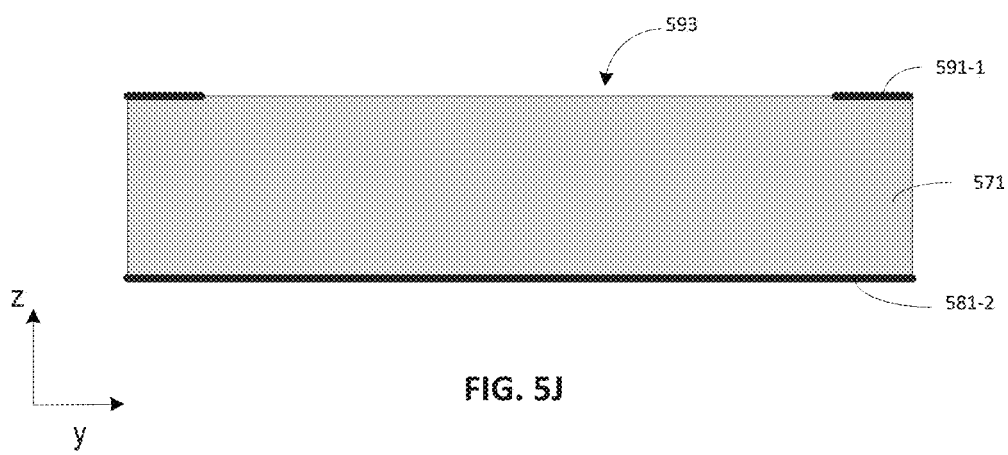

Proceeding to FIG. 5J, hard mask material layer 581-1 may be patterned to form a patterned hard mask layer 591-1 that has an opening 593 exposing a portion of base substrate 571, as depicted by structure 590. A location of opening 593 may correspond to the location of initial mirror-base layer 563 along the z axis. The formation of patterned hard mask layer 591-1 may be similar to the formation of patterned hard mask layer 495-2 and is not repeated herein.

Figure 5K:
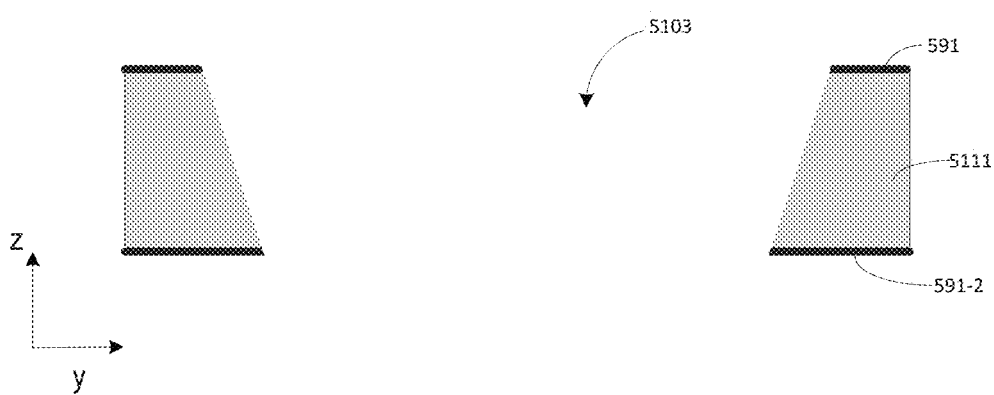

Proceeding to FIG. 5K, an initial cavity 5103 may be formed in base substrate 571, as depicted by structure 5100. In some embodiments, initial cavity 5103 extends from the top surface to the bottom surface of base substrate 571. A patterned base substrate 5111 may be formed. The formation of initial cavity 5103 may be similar to the formation of initial cavity 493 and is not repeated herein.

Figure 5L:
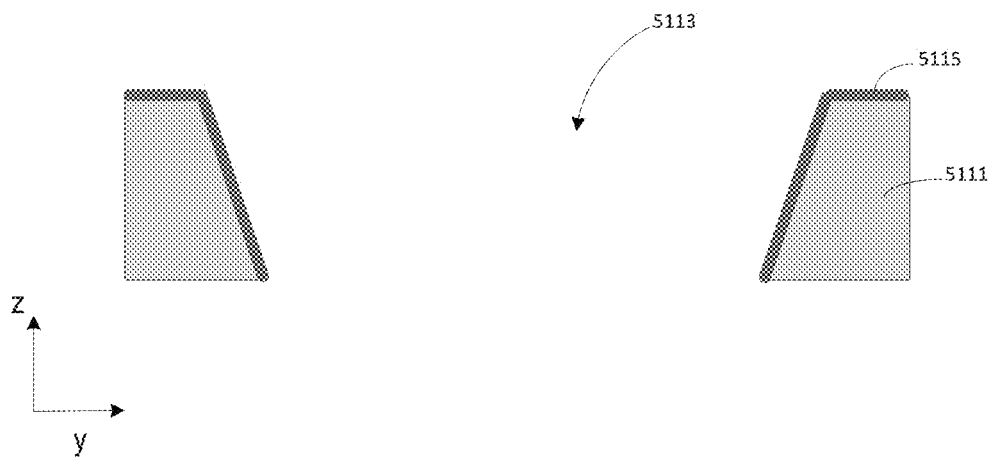

Proceeding to FIG. 5L, a cavity 5113 may be formed by deposition an insulating layer 5115 to cover the sidewall of initial cavity 5103 and a top surface of patterned base substrate 5111, as depicted by structure 5110. The deposition of insulating layer 5115 may be similar to the deposition of insulator portion 4111 and is not repeated herein.

Figure 5M:
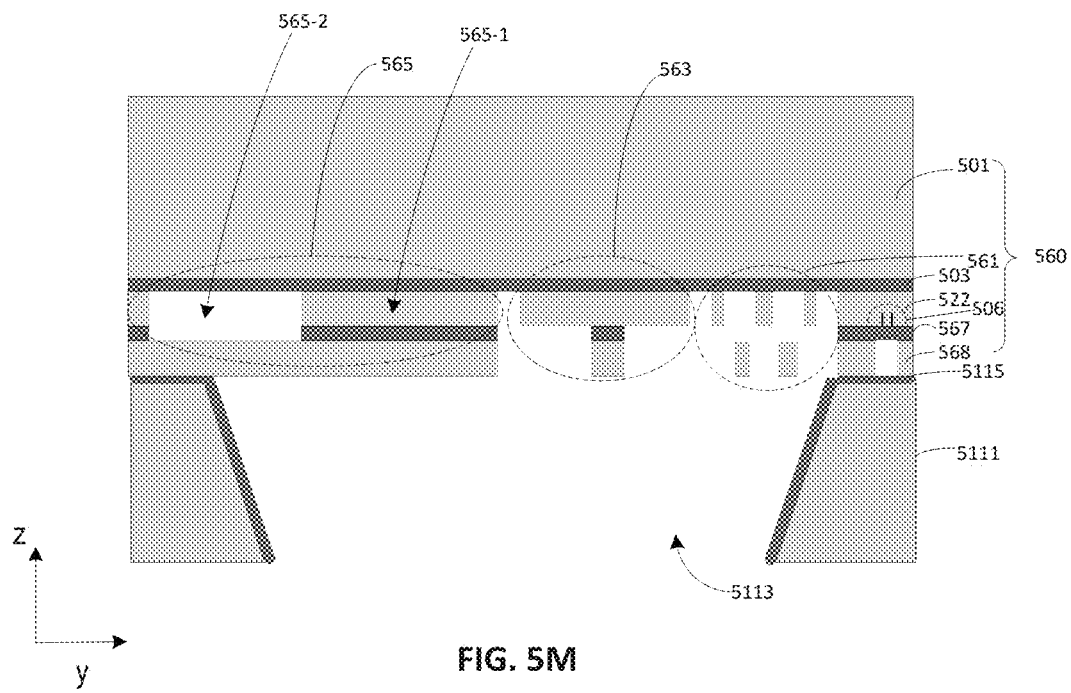

Proceeding to FIG. 5M, structure 560 may be bonded onto structure 5110 so that base substrate 501 is on top of insulator layer 503, and cavity 5113 exposes first surface of initial mirror-base layer 563, as depicted by structure 5120. In some embodiments, heat and/or pressure may be applied on structure 5120 to enhance the bonding between second patterned base material layer 568 and insulating layer 5115. In some embodiments, alignment mark 506 is used to align structure 560 with structure 5110 for the bonding process.

Figure 5N:
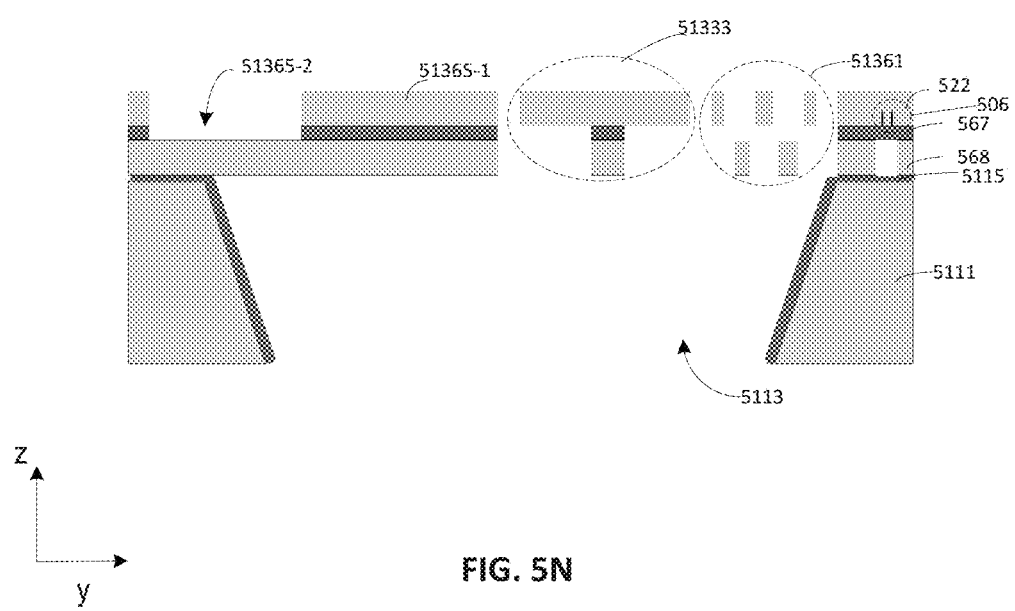

Referring back to FIG. 6B, after the first material substrate and the second material substrate are bonded, a portion of the first material substrate is removed to expose a second surface of the initial mirror-base layer and form a mirror-base layer exposing its first and second surfaces (Step 656 of FIG. 6B). FIG. 5N illustrates a corresponding structure.

Proceeding to FIG. 5N, a portion of structure 560 (e.g., a top portion of structure 5120) may be removed to expose patterned base material layer 522 and form a mirror-base layer 51333 exposing its top surface and bottom surface, as depicted in structure 5130. In some embodiments, base substrate 501 and insulator layer 503 are removed to expose the second surface of initial mirror-base layer 563. A second surface of initial mirror-base layer 563 may form a top surface of mirror-base layer 51333, and a first surface of initial mirror-base layer 563 may form a bottom surface of mirror-base layer 51333. In some embodiments, electrode-forming sub-structures 51365-1 and 51365-2 and a hinge structure 51361 are formed. The removal of base substrate 501 and insulator layer 503 may include a CMP process and/or a recess etching (e.g., dry and/or wet etch) process.

Figure 5O:
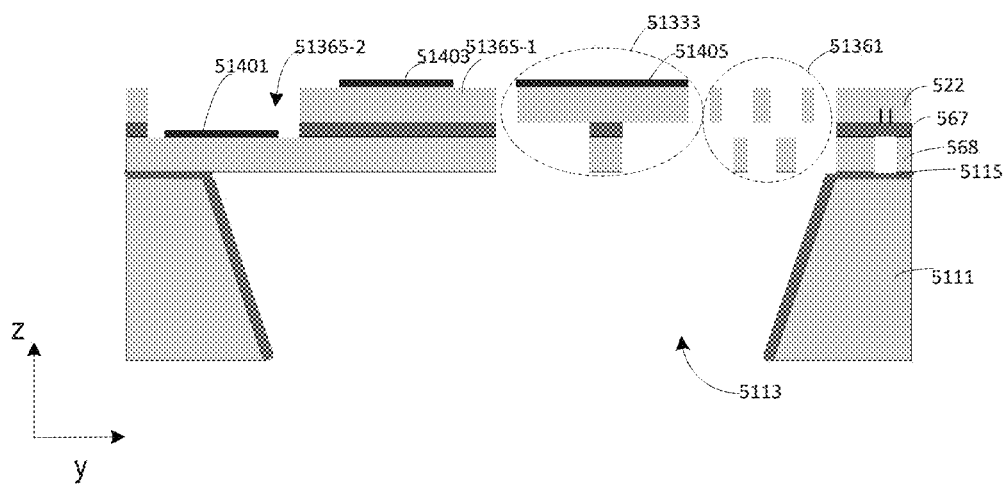

Referring back to FIG. 6B, after the formation of mirror-base layer, a first reflective layer can be formed on the top surface and a second reflective layer can be formed on the bottom surface of the mirror-base layer, the first reflective layer and the second reflective layer being made of a same material and having nominally same dimensions (Step 658 of FIG. 6B). FIGS. 5O-5P illustrate corresponding structures. In some embodiments, the operation illustrated in FIG. 5O may be performed before or after the operation illustrated in FIG. 5P.

Proceeding to FIG. 5O, a first reflective layer 51405 may be deposited on top surface of mirror-base layer 51333, as depicted in structure 5140. In some embodiments, electrodes 51401 and 51403 may respectively be deposited at electrode-forming sub-structures 51365-2 and 51365-1 employing the same deposition process to form first reflective layer 51405. Proceeding to FIG. 5P, second reflective layer 51505 may be deposited on bottom surface of mirror-base layer 51333, e.g., through cavity 5113. In some embodiments, first and second portions of bottom surface of mirror-base layer 51333 may have different elevations along the z axis, and a total area of top surfaces of first and second portions of the bottom surface deposited with second reflective layer 51505 is at least nominally the same as the area of the top surface deposited with first reflective layer 51405. The material, deposition process, and benefits to form of first and second reflective layers 51405 and 51505 may be the same as or similar to those of first and second reflective layers 4123 and 4135, and are not repeated herein.

It will be apparent to those skilled in the art that various modifications and variations can be made to the disclosed system and related methods. Other embodiments will be apparent to those skilled in the art from consideration of the specification and practice of the disclosed system and related methods.

It is intended that the specification and examples be considered as exemplary only, with a true scope being indicated by the following claims and their equivalents.

What is claimed is:

1. A micromachined mirror assembly, comprising:
   a mirror-base layer; and
   a first reflective layer on a top surface of the mirror-base layer and a second reflective layer on a bottom surface of the mirror-base layer, wherein:
   the first reflective layer is reflective to incident light of the micromachined mirror assembly,
   the first reflective layer and the second reflective layer are made of a same material and have same dimensions, and
   the first reflective layer and the second reflective layer are each externally exposed at a respective surface facing away from the mirror-base layer.

2. The micromachined mirror assembly of claim 1, wherein the first and the second reflective layers are each made of at least one of metal and a distributed Bragg reflector that have same thermal expansion coefficient and same Young's modulus.

3. The micromachined mirror assembly of claim 2, wherein the first and second reflective layers include aluminum, gold, or a combination thereof.

4. The micromachined mirror assembly of claim 1, wherein the first and second reflective layers each has a same thickness and a total area.

5. The micromachined mirror assembly of claim 1, wherein a stress gradient through the first reflective layer, the mirror-base layer, and the second reflective layer is equal to zero along a direction perpendicular to the top surface of the mirror-base layer.

6. The micromachined mirror assembly of claim 1, wherein the mirror-base layer includes silicon.

7. The micromachined mirror assembly of claim 1, wherein at least one of the top surface and the bottom surface includes more than one portions, the respective top surfaces of the more than one portions being positioned at different elevations along a direction perpendicular to the respective surface.

8. An optical sensing system, comprising:
a transmitter configured to scan a laser beam towards an object, wherein the transmitter comprises a micromachined mirror assembly that outputs the laser beam, the micromachined mirror assembly comprising a rotatable mirror that comprises:
a mirror-base layer; and
a first reflective layer on a top surface of the mirror-base layer and a second reflective layer on a bottom surface of the mirror-base layer, wherein:
the first reflective layer is reflective to incident light of the micromachined mirror assembly,
the first reflective layer and the second reflective layer are made of a same material and have same dimensions, and
the first reflective layer and the second reflective layer are each externally exposed at a respective surface facing away from the mirror-base layer; and
a receiver configured to detect a returned laser from the object.

9. The optical sensing system of claim 8, wherein the first and the second reflective layers are each made of at least one of metal and a distributed Bragg reflector that have same thermal expansion coefficient and same Young's modulus.

10. The optical sensing system of claim 9, wherein the first and second reflective layers include aluminum, gold, or a combination thereof.

11. The optical sensing system of claim 8, wherein the first and second reflective layers each has a same thickness and a total area.

12. The optical sensing system of claim 8, wherein a stress gradient through the first reflective layer, the mirror-base layer, and the second reflective layer is equal to zero along a direction perpendicular to the top surface of the mirror-base layer.

13. The optical sensing system of claim 8, wherein the mirror-base layer includes silicon.

14. The optical sensing system of claim 8, wherein at least one of the top surface and the bottom surface includes more than one portions, the respective top surfaces of the more than one portions being positioned at different elevations along a direction perpendicular to the respective surface.

15. The optical sensing system of claim 8, further comprising an additional rotatable mirror and a stationary mirror, wherein
the rotatable mirror receives a first laser signal and reflects the first light signal towards the stationary mirror to form a second laser signal;
the stationary mirror receives the second laser signal and reflects the second laser signal towards the additional rotatable mirror to form a third laser signal; and
the additional rotatable mirror receives the third laser signal and reflects the third laser signal as the laser beam.

16. The optical system of claim 15, wherein the additional rotatable mirror is identical to the rotatable mirror.

17. A transmitter in an optical sensing system, comprising:
a scanner configured to scan a laser beam towards an object, wherein the scanner comprises a micromachined mirror assembly that comprises a rotatable mirror configured to receive and reflect a laser signal as the laser beam, the rotatable mirror comprising:
a mirror-base layer; and
a first reflective layer on a top surface of the mirror-base layer and a second reflective layer on a bottom surface of the mirror-base layer, wherein:
the first reflective layer is reflective to incident light of the micromachined mirror assembly,
the first reflective layer and the second reflective layer are made of a same material and have same dimensions, and
the first reflective layer and the second reflective layer are each externally exposed at a respective surface facing away from the mirror-base layer.

18. The transmitter of claim 17, wherein the first and the second reflective layers are each made of at least one of metal and a distributed Bragg reflector that have same thermal expansion coefficient and same Young's modulus.

19. The transmitter of claim 18, wherein the first and second reflective layers include aluminum, gold, or a combination thereof.

20. The transmitter of claim 17, wherein the first and second reflective layers each has a same thickness and a total area.

* * * * *